(12) United States Patent
Hung et al.

(10) Patent No.: US 12,477,778 B2
(45) Date of Patent: Nov. 18, 2025

(54) EPITAXIAL STRUCTURE FOR SOURCE/DRAIN CONTACT FOR SEMICONDUCTOR STRUCTURE HAVING FIN STRUCTURE

(71) Applicant: TAIWAN SEMICONDUCTOR MANUFACTURING COMPANY, LTD., Hsinchu (TW)

(72) Inventors: Tsungyu Hung, Hsinchu (TW); Pang-Yen Tsai, Hsin-Chu Hsian (TW); Ding-Kang Shih, New Taipei (TW); Sung-Li Wang, Hsinchu (TW); Chia-Hung Chu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 837 days.

(21) Appl. No.: 17/472,540

(22) Filed: Sep. 10, 2021

(65) Prior Publication Data
US 2022/0293760 A1    Sep. 15, 2022

Related U.S. Application Data

(60) Provisional application No. 63/159,885, filed on Mar. 11, 2021.

(51) Int. Cl.
*H10D 30/67* (2025.01)
*H01L 21/02* (2006.01)
(Continued)

(52) U.S. Cl.
CPC ... *H10D 30/6735* (2025.01); *H01L 21/02293* (2013.01); *H01L 21/02532* (2013.01);
(Continued)

(58) Field of Classification Search
CPC .......... H10D 30/6735; H10D 30/6757; H10D 84/013; H10D 84/038; H10D 30/031
See application file for complete search history.

(56) References Cited

U.S. PATENT DOCUMENTS

| 7,015,116 B1 | 3/2006 | Lo et al. |
| 8,962,400 B2 | 2/2015 | Tsai et al. |

(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.

(Continued)

*Primary Examiner* — Michael Jung
(74) *Attorney, Agent, or Firm* — Sterne, Kessler, Goldstein & Fox P.L.L.C.

(57) ABSTRACT

Low-resistance contacts improve performance of integrated circuit devices that feature epitaxial source/drain regions. The low resistance contacts can be used with transistors of various types, including planar field effect transistors (FETs), FinFETs, and gate-all-around (GAA) FETs. Low-resistance junctions are formed by removing an upper portion of the source/drain region and replacing it with an epitaxially-grown boron-doped silicon germanium (SiGe) material. Material resistivity can be tuned by varying the temperature during the epitaxy process. Electrical contact is then made at the low-resistance junctions.

20 Claims, 25 Drawing Sheets

(51) Int. Cl.
*H10D 30/01* (2025.01)
*H10D 62/10* (2025.01)
*H10D 84/01* (2025.01)
*H10D 84/03* (2025.01)

(52) U.S. Cl.
CPC ....... *H10D 30/031* (2025.01); *H10D 30/6757* (2025.01); *H10D 62/118* (2025.01); *H10D 84/013* (2025.01); *H10D 84/038* (2025.01)

(56) References Cited

U.S. PATENT DOCUMENTS

| | | | |
|---|---|---|---|
| 9,093,514 B2 | 7/2015 | Tsai et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,406,804 B2 | 8/2016 | Huang et al. | |
| 9,418,897 B1 | 8/2016 | Ching et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,363 B1 | 11/2017 | Liao et al. | |
| 9,831,183 B2 | 11/2017 | Lin et al. | |
| 9,859,380 B2 | 1/2018 | Lee et al. | |
| 9,859,386 B2 | 1/2018 | Ho et al. | |
| 10,431,502 B1 * | 10/2019 | Lee | H10D 84/017 |
| 2014/0077279 A1 | 3/2014 | Tu | |
| 2015/0270122 A1 | 9/2015 | Tolle et al. | |
| 2015/0348966 A1 | 12/2015 | Zhao et al. | |
| 2016/0049335 A1 | 2/2016 | Liu et al. | |
| 2016/0148932 A1 | 5/2016 | Fujita et al. | |
| 2016/0308048 A1 | 10/2016 | Ching et al. | |
| 2017/0250183 A1 | 8/2017 | Brunco | |
| 2022/0190159 A1 * | 6/2022 | Paul | H10D 30/014 |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

\* cited by examiner

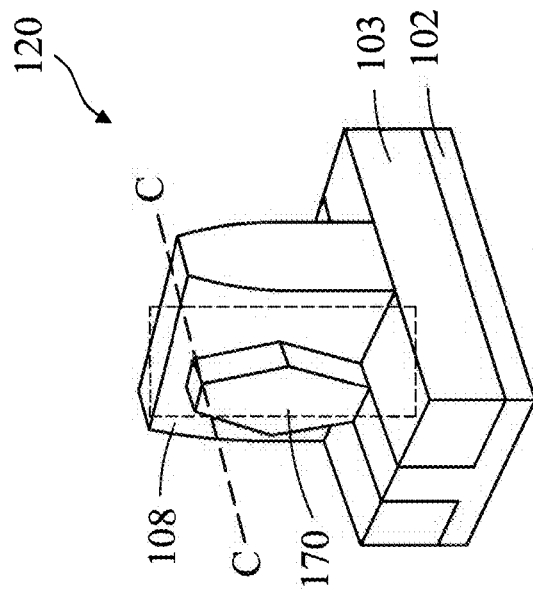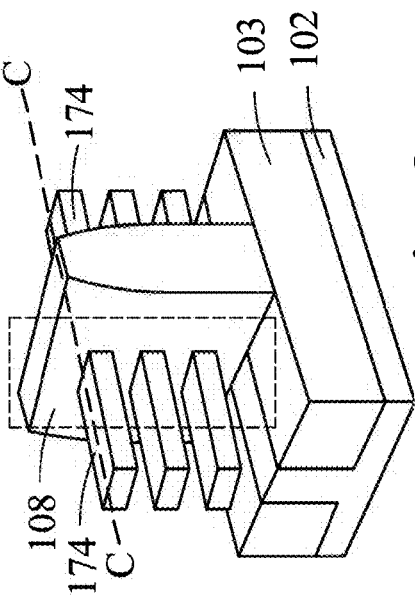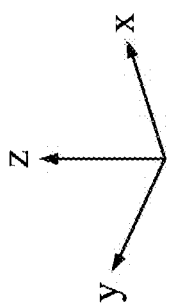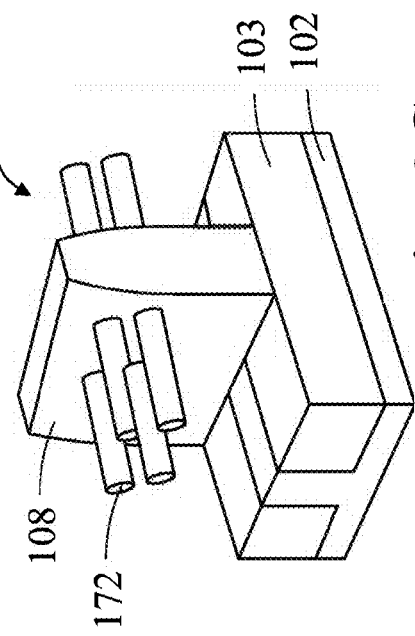

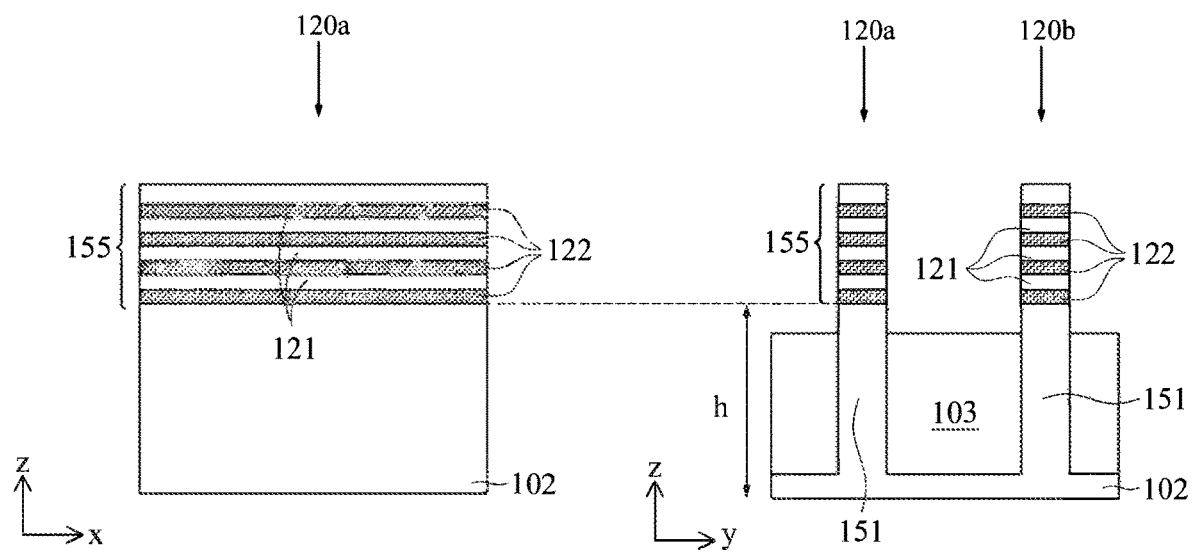

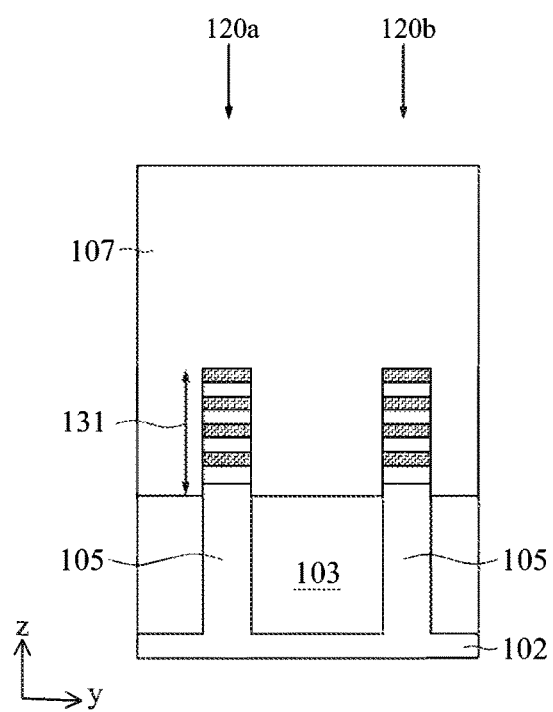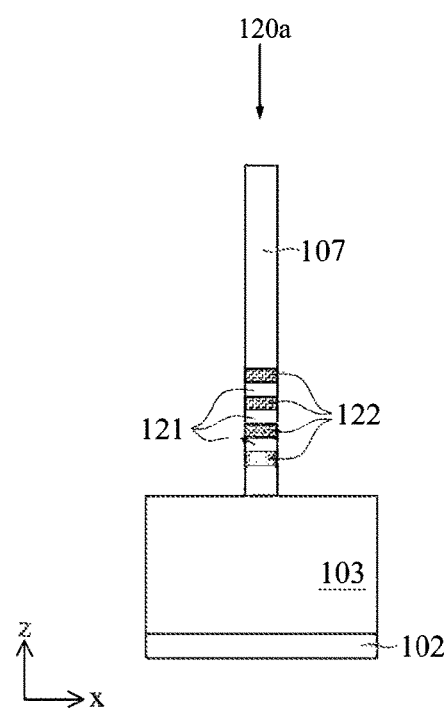
Fig. 6B
Fig. 6C

EPITAXIAL STRUCTURE FOR SOURCE/DRAIN CONTACT FOR SEMICONDUCTOR STRUCTURE HAVING FIN STRUCTURE

CROSS-REFERENCE TO RELATED APPLICATION

This patent application claims benefit of U.S. Provisional Patent Application No. 63/159,885 filed on Mar. 11, 2021 and titled "A New Contact Epi with Low Source Drain Contact Resistance," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. Dimensions of the various features may be arbitrarily increased or reduced for clarity of discussion. In the figures, identical reference numerals identify similar features or elements.

FIGS. 2A-2D are isometric views of FinFET and GAAFET semiconductor devices, in accordance with some embodiments.

FIGS. 5A-5C are cross-sectional views illustrating process operations for forming superlattice structures, in accordance with some embodiments.

FIGS. 6A-8E are isometric and cross-sectional views of the exemplary GAAFETs shown in FIGS. 2B, 2D, and 3B at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
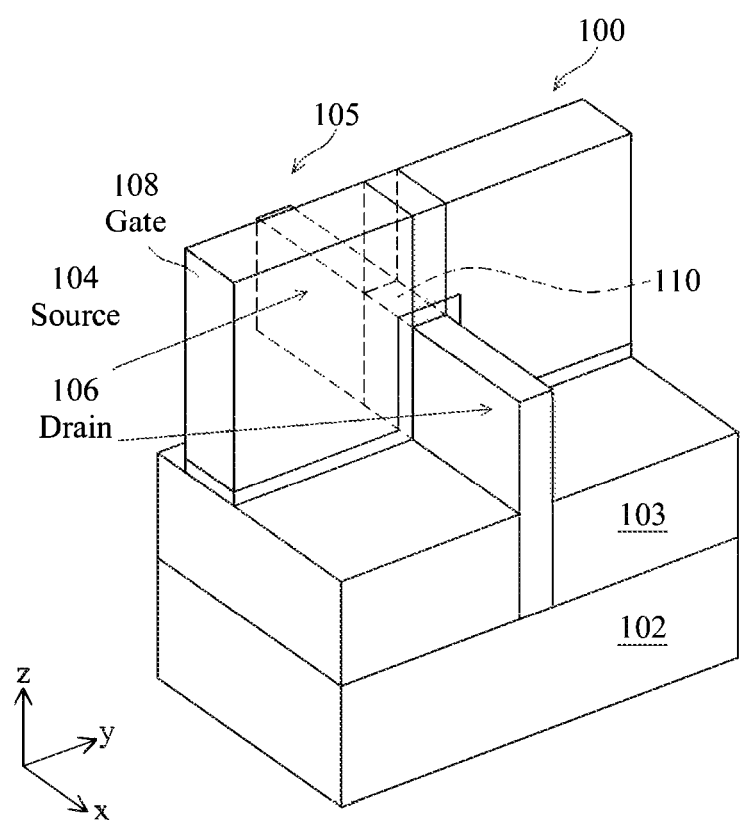
FIG. 1 is an isometric view of a FinFET, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Structures disclosed herein may be patterned by various methods. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

FIG. 1 is an isometric view of a FinFET 100, with transparency, in accordance with some embodiments. FinFET 100 includes a substrate 102, isolation regions 103, a fin having source and drain regions 104 and 106, respectively (each also referred to as "source/drain region 105"), a gate structure 108, and a channel 110. FinFET 100 is formed on substrate 102. Shallow trench isolation (STI) regions 103 are formed in substrate 102 to electrically isolate neighboring FinFETs 100 from one another. A fin including source/drain regions 105 is formed from a portion of substrate 102, extending outward from an upper surface of substrate 102 in the z-direction. Source and drain regions 104 and 106, respectively, are doped with either a positive or a negative species to provide charge reservoirs for FinFET 100. For example, for a negative FET (NFET), source/drain region 105 can include the substrate material, such as Si, and n-type dopants. For a positive FET (PFET), source/drain region 105 can include the substrate material, such as Si and SiGe, and p-type dopants. In some embodiments, the term "p-type" defines a structure, layer, and/or region as being doped with, for example, boron (B), indium (In), or gallium (Ga). In some embodiments, the term "n-type" defines a structure, layer, and/or region as being doped with, for example, phosphorus (P) or arsenic (As). An NFET device may be disposed in a p-type region of substrate 102, or PWELL. A PFET device may be disposed in an n-type region of substrate 102, or NWELL.

During operation of FinFET 100, current flows from source region 104 to drain region 106, through channel 110, in response to a voltage applied to gate structure 108. Gate structure 108 surrounds three sides of the fin, so as to control the current flow through channel 110. Gate structure 108 can be a multi-layered structure that includes (not shown) a gate electrode, a gate dielectric that separates the gate electrode from the fin, and sidewall spacers, as described in greater detail below. A single FinFET is shown in FIG. 1. However, gate structure 108 may wrap around multiple fins arranged along the y-axis to form multiple FinFETs. Likewise, separated regions of a single fin may be controlled by multiple gates arranged, along the x-axis, to form multiple FinFETs.

When the voltage applied to gate structure 108 exceeds a certain threshold voltage, FinFET 100 switches on and current flows through channel 110. If the applied voltage drops below the threshold voltage, FinFET 100 shuts off, and current ceases to flow through channel 110. Because the wrap-around arrangement of gate structure 108 influences channel 110 from three sides, improved control of the conduction properties of channel 110 is achieved in FinFET 100, compared with planar FETs.

A FinFET in which channel 110 takes the form of a multi-channel stack is known as agate-all-around (GAA) FET. In a GAAFET, the multiple channels within the stack are surrounded on all four sides by the gate, so as to further improve control of current flow in the channels.

FIGS. 2A-2D illustrate different types of FinFET and GAAFET structures, in accordance with some embodiments. FIG. 2A shows an isometric view of FinFET 100 of FIG. 1, rotated by 90 degrees. FIGS. 2B-2D show similar isometric views of generic GAAFETs that are variations on the design of FinFET 100. GAAFETs having 1-D, linear channels, or nano-wires 172 are known as nano-wire FETs 116 (FIG. 2C); GAAFETs having 2-D channels, or nano-sheets 174, are known as nano-sheet FETs 118 (FIG. 2D). GAAFETs in which the fins have been recessed in the source/drain regions and replaced by epitaxial source/drain regions 170 are known as epi source/drain GAAFETs 120 (FIG. 2B).

Embodiments of the present disclosure are shown and described, by way of example, as epi source/drain planar FETs 114 and epi source/drain GAAFETs 120 (e.g., as shown in FIGS. 2B and 2D having certain features. However, such features described herein may be applied to other types of FETs—for example, FinFET 100 or FETs having nano-structured channel regions, such as stacked channel nano-wire FETs (e.g., as shown in FIG. 2C) and stacked channel nano-sheet FETs (e.g., as shown in FIG. 2D). Structures such as those shown in FIGS. 2A-2D may be formed on a common substrate 102, or on different substrates.

High performance integrated circuits, which include devices such as those shown in FIGS. 2A-2D, benefit from low contact resistance, where interconnect wiring joins the source and drain terminals of FETs. Interconnect wiring is not shown herein for simplicity purposes. Contact resistance depends, in part, on the resistivity of materials used in the interconnect wiring and at the terminals of the device, as well as on the geometry of the junctions. Manufacturing processes, as described below, that affect material structure at the source/drain contacts can therefore raise or lower the source/drain contact resistance and/or its variability and can significantly affect overall circuit performance.

Figure 3A:
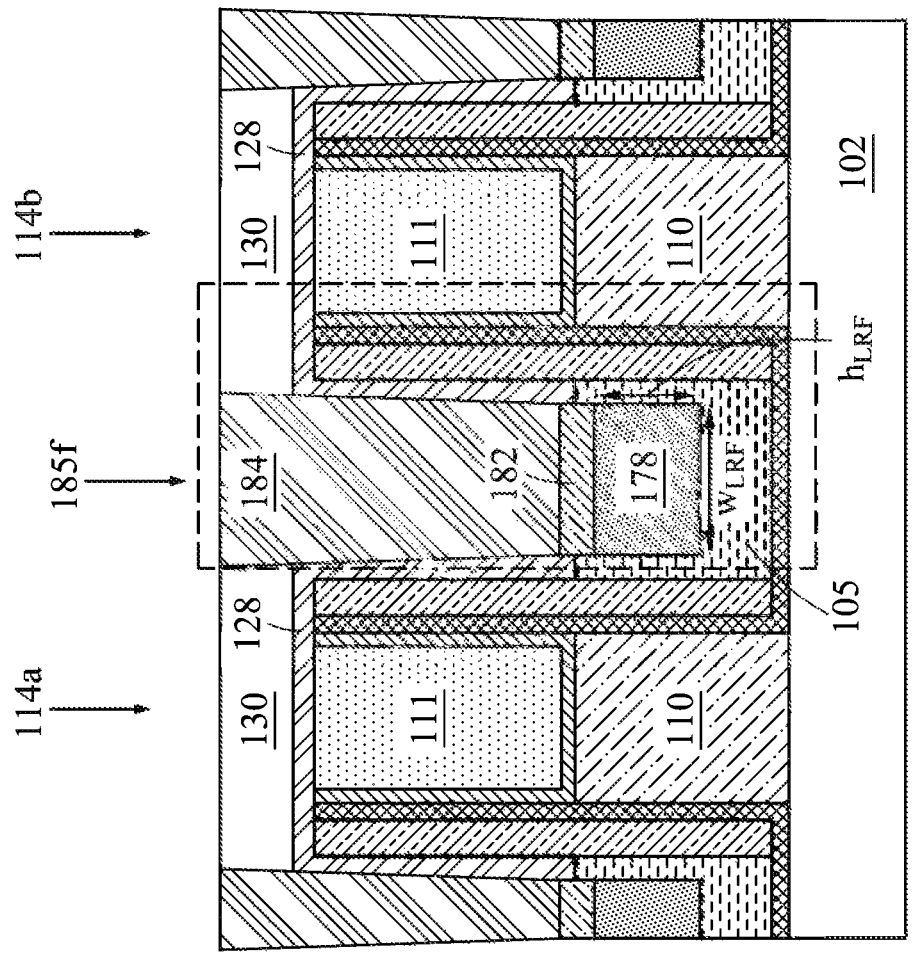
FIG. 3A is a crass-sectional view of a planar device, in accordance with some embodiments.
Figure 3B:
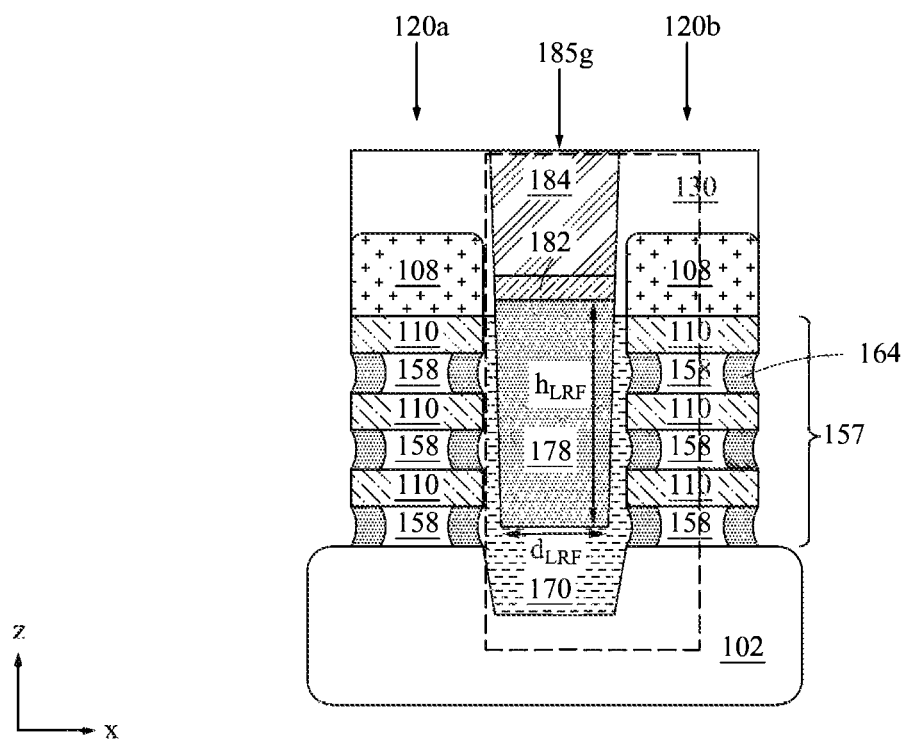
FIG. 3B is a cross-sectional view of a gate-all-around (GAA) FET device corresponding to FIGS. 2B and 2D along cut lines C-C, in accordance with some embodiments.

FIGS. 3A and 3B illustrate the structure of source/drain contacts 185f and 185g when applied to planar FETs and GAAFETs 114 and 120, respectively. Corresponding regions of the GAAFET devices are indicated by dotted-line boxes shown in FIGS. 2B, 2D, 3A, and 3B. Each dotted line box surrounds a portion of channel region 157 and a portion of the source/drain region of the FET. The structures of interest are source/drain contacts 185f and 185g to the source/drain regions 105 and 170 of planar FET 114 and GAAFET 120, respectively. The shapes and sizes of the source/drain regions 105 and 170 and the source/drain contacts 185f and 185g are influenced, in part, by the structure of the adjacent channel regions.

FIGS. 3A and 3B are cross-sectional views along cut lines C-C shown in FIGS. 2A and 2B. FIG. 3A is a cross-sectional view representing a pair of metal gate planar FETs 114a and 114b sharing a source/drain region 105. Gate regions of planar FETs 114a and 114b on either side of the shared source/drain region 105 include gate structure 108, channel 110, and gate dielectric 112. Source/drain contact 185*f* extends through ILD 130 to form an electrical junction with source/drain region 105 shared between planar FETs 114*a* and 114*b*. Source/drain contact 185*f* includes contact metal 184, silicide layer 182, and source/drain contact layer 178.

FIG. 3B is a cross-sectional view, representing a pair of GAAFETs 120*a* and 120*b* sharing an epitaxial source/drain region 170. Gate regions of GAAFETs 120*a* and 120*b* on either side of the shared epitaxial source/drain region 170 include gate structures 108 and GAA channel regions 157. Components of GAA channel regions 157 include nanostructured channels 110, inner spacers 164, and GAA structures 158, which are nano-structured portions of the gate structure 108. In some embodiments, the term "nanostructured" defines a structure, layer, and/or region as having a horizontal dimension (e.g., along an X- and/or Y-axis) and/or a vertical dimension (e.g., along a Z-axis) less than, for example, 100 nm. Source/drain contact 185*g* includes contact metal 184, silicide layer 182, and source/drain contact layer 178. Source/drain contact 185*g* forms an electrical junction with epitaxial source/drain region 170 of GAAFETs 120*a* and 120*b*. In both FIGS. 3A and 3B, contact metal 184 is substantially co-planar with ILD 130.

Figure 4:
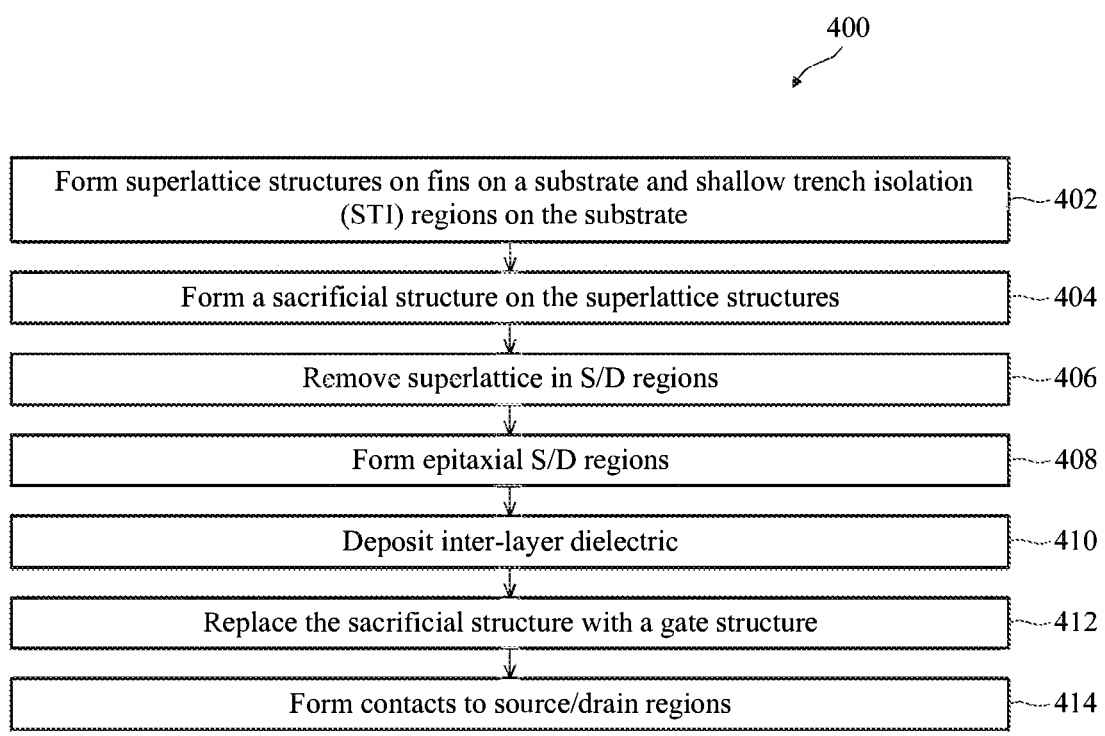
FIG. 4 is a flow diagram of a method for fabricating the GAAFETs shown in FIGS. 2B, 2D, and 3B, in accordance with some embodiments.

FIG. 4 is a flow diagram of a method 400 for fabricating the exemplary epi source/drain GAAFET 120 of FIG. 2B, according to some embodiments. For illustrative purposes, operations illustrated in FIG. 4 will be described with reference to the exemplary process for fabricating GAAFET 120, as illustrated in FIGS. 5A-8E, which are isometric and cross-sectional views of GAAFET 120 at various stages of its fabrication, according to some embodiments.

Operations of method 400 can be performed in a different order, or not performed, depending on specific applications. It is noted that method 400 may not produce a complete semiconductor device. Accordingly, it is understood that additional processes can be provided before, during, or after method 400, and that some of these additional processes may only be briefly described herein.

Figure 5A:
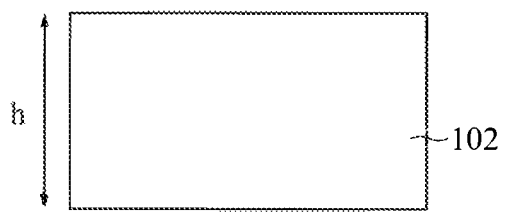

In operation 402, superlattice structures are formed on fin structures, on a substrate. For example, as shown FIGS. 5A-5C, superlattice structures 155 are formed on fin structures, e.g., fins 151, on substrate 102. FIG. 5A illustrates a cross-sectional view of semiconductor substrate 102 prior to forming superlattice structures 155. FIG. 5B illustrates a cross-sectional view of substrate 102 after formation of superlattice structures 155. FIG. 5C illustrates a cross-sectional view of substrate 102 after superlattice structures 155 have been patterned to form fins 151 and after formation of STI regions 103.

Referring to FIG. 5A, substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 can include a glass substrate. In some embodiments, substrate 102 can include a flexible substrate made of, for example, plastic. In some embodiments, substrate 102 can include a crystalline substrate, where a top surface of substrate 102 can be parallel to the (100), (110), (111), or c-plane (0001) crystal plane. In some embodiments, substrate 102 may be a silicon-on-insulator (SOI) substrate that contains a buried layer, e.g., a buried oxide layer. Substrate 102 has a total height h.

Referring to FIGS. 5B and 5C, superlattice structures 155 can include a stack of nanostructured layers 121 and 122 arranged in an alternating configuration. In some embodiments, nanostructured layers 121 include materials similar to one another, e.g., epitaxial Si, and nanostructured layers 122 include materials similar to one another, e.g., epitaxial SiGe. In some embodiments, superlattice structures 155 are formed by etching a stack of two different semiconductor layers (not shown) arranged in the alternating configuration. Nanostructured layers 122 are replaced in subsequent processing, while nanostructured layers 121 remain as part of semiconductor devices 120. Although FIGS. 5B-5C show three nanostructured layers 121 and four nanostructured layers 122, any number of nanostructured layers can be included in each superlattice structure 155. The alternating configuration of superlattice structure 155 can be achieved by alternating deposition, or epitaxial growth, of SiGe and Si layers, starting from the top silicon layer of substrate 102. Etching the Si layers can form nanostructured layers 121, which are interleaved with SiGe nanostructured layers 122. Each of the nanostructured layers 121-122 may have thicknesses between about 3 nm and about 10 nm. In some embodiments, the topmost nanostructured layers (e.g., Si layers) of superlattice structures 155 may be thicker than the underlying nanostructured layers.

The superlattice structure 155, as a multi-layer stack of two different semiconductor materials, can be formed via an epitaxial growth process. The epitaxial growth process can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), or another suitable CVD process; (ii) molecular beam epitaxy (MBE) processes (iii) another suitable epitaxial process; or (iv) a combination thereof. In some embodiments, source-drain regions can be grown by an epitaxial deposition/partial etch process, which repeats the epitaxial deposition/partial etch process at least once. Such repeated deposition/partial etch process is also called a "cyclic deposition-etch (CDE) process." In some embodiments, source-drain regions can be grown by selective epitaxial growth (SEG), where an etching gas can be added to promote selective growth on exposed semiconductor surfaces of substrate 102 or the fin, but not on insulating material (e.g., dielectric material of STI regions 103). Following the formation of superlattice structures 155, etching of the silicon substrate 102 can continue, to form fins 151, as shown in FIGS. 5B-5C. In a GAAFET, fins 151 provide structural support for superlattice structures 155.

The trenches around fins 151 are then filled with an insulating material to form STI regions 103, as shown in FIG. 5C. For example, STI regions 103 can be deposited and then etched back to a desired height. Insulating material in STI regions 103 can include, for example, a silicon oxide ($SiO_2$), silicon nitride (SiN), silicon oxynitride (SiON), fluoride-doped silicate glass (FSG), or a low-k dielectric material, and/or other suitable insulating material. In some embodiments, the term "low-k" refers to a low dielectric constant. In the field of semiconductor device structures and manufacturing processes, low-k refers to a dielectric constant that is less than the dielectric constant of $SiO_2$ (e.g., less than 3.9). In some embodiments, STI regions 103 can include a multi-layered structure. In some embodiments, the process of depositing the insulating material can include any deposition method suitable for flowable dielectric materials (e.g., flowable silicon oxide). For example, flowable silicon oxide can be deposited for STI regions 103 using a flowable CVD (FCVD) process. The FCVD process can be followed by a wet anneal process. In some embodiments, the process of depositing the insulating material can include depositing a low-k dielectric material to form a liner. In some embodiments, a liner made of another suitable insulating material, can be placed between STI region 103 and adjacent FETs.

In some embodiments, STI region 103 may be annealed. Annealing the insulating material of STI regions 103 can include annealing the deposited insulating material in a steam environment at a temperature between about 200° C. and about 700° C. for a time period in a range from about 30 min to about 120 min. The anneal process can be followed by a polishing process that can remove a surface layer of the insulating material. The polishing process can be followed by the etching process to recess the polished insulating material to form STI regions 103. The recessing of the polished insulating material can be performed, for example, by a dry etch process, a wet etch process, or a combination thereof. In some embodiments, the dry etch process for recessing the polished insulating material can include using a plasma dry etch with a gas mixture that can include octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure between about 1 mTorr and about 5 mTorr. In some embodiments, the wet etch process for recessing the polished insulating material can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process for recessing the polished insulating material can include using an etch process that uses ammonia ($NH_3$) and hydrofluoric acid (HF) as etchants and inert gases, such as Ar, xenon (Xe), He, and a combination thereof. In some embodiments, the flow rate of HF and $NH_3$ used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a temperature ranging from about 50° C. to about 120° C.

Figure 6A:
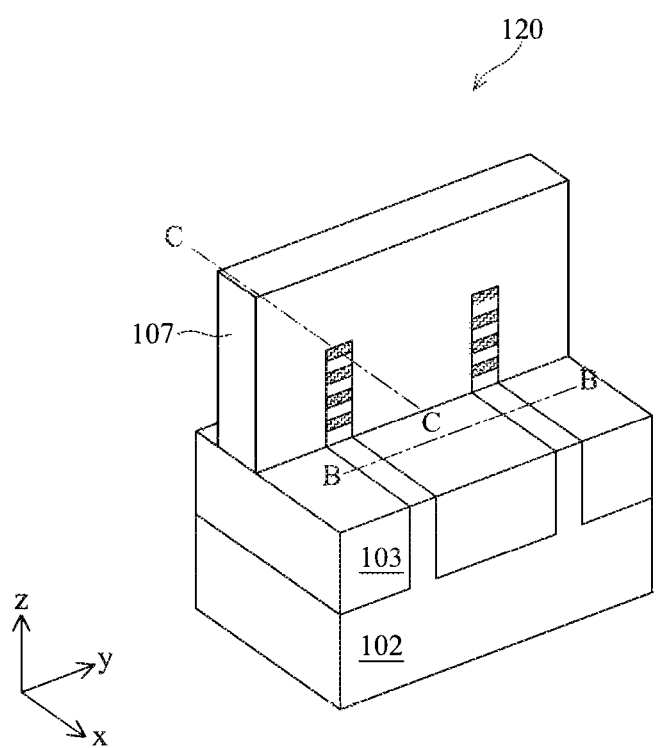

Referring to FIG. 4, in operation 404, a sacrificial structure 107 is formed around superlattice structures 155, as shown in FIGS. 6A-6C. Sacrificial structure 107 includes a polysilicon layer 153 and optionally, one or more sacrificial hard mask layers, omitted for simplicity. Sacrificial structure 107 can also include a sidewall spacer 128. Polysilicon layer 153 can be deposited and then patterned using the hard mask layer(s), which can be retained during additional processing, or removed. Hard mask layers can be made of, for example, an oxide material or a silicon nitride (SiN) material that can be grown and/or deposited using an ALD process. Alternatively, the hard mask used to pattern polysilicon layer 153 can be deposited by any suitable method and can be patterned using a photoresist mask. Sidewall spacer 128 can be made of, for example, a silicon nitride (SiN) material that can be grown and/or deposited using an ALD process. Sacrificial structure 107 is replaced later in the fabrication process, at operation 210, by gate structure 108, which includes metal layers.

Referring to FIG. 4, in operation 406, superlattice structure 155 is removed in the source/drain regions so that nanostructured layers 121 and 122 remain under sacrificial structure 107. Removal of superlattice structure 155 in the source/drain regions can be accomplished using a mask to expose the source/drain regions, followed by an etch-back process using, for example, a diluted hydrofluoric acid (HF) wet etch process. HF can remove both silicon and SiGe nanostructured layers 121 and 122 outside the channel region, while the channel region is protected by hard mask and/or spacer layers of sacrificial structure 107. Such layers, if made of SiN, will not be etched by the HF. Alternatively, a dry etch process can be used to remove superlattice structure 155 in the source/drain regions.

Figure 7A:
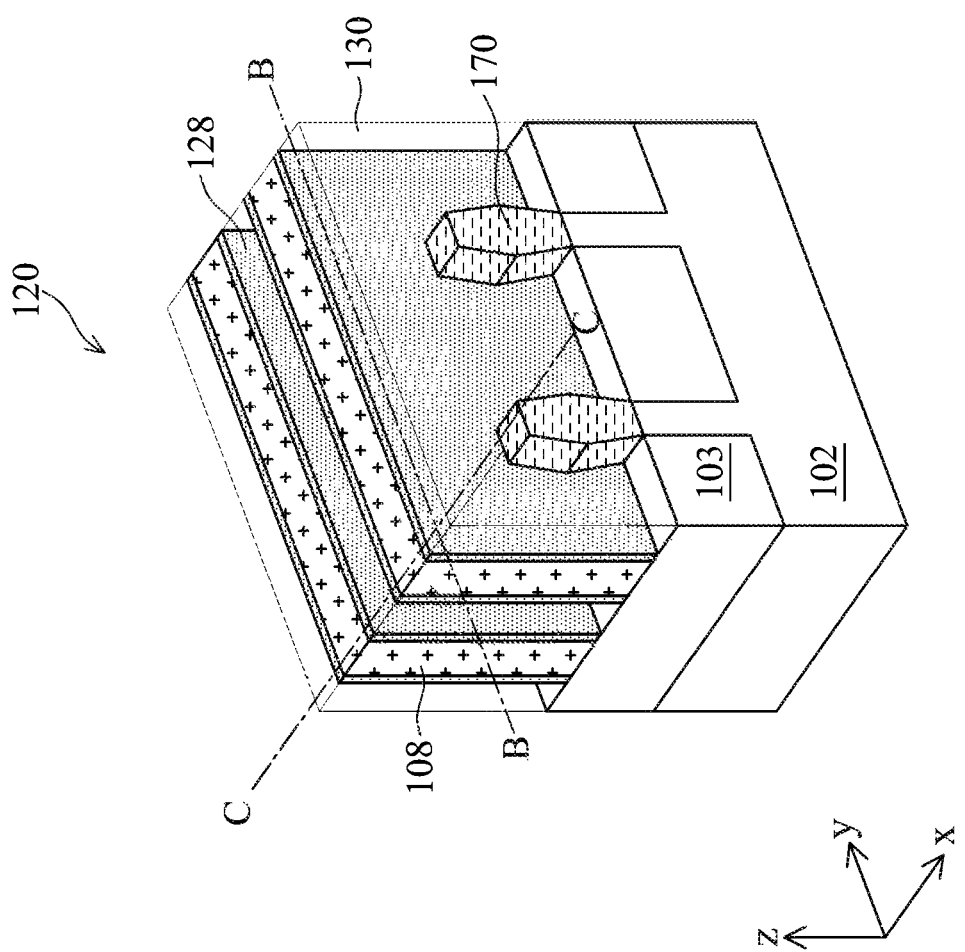
Figure 7B:
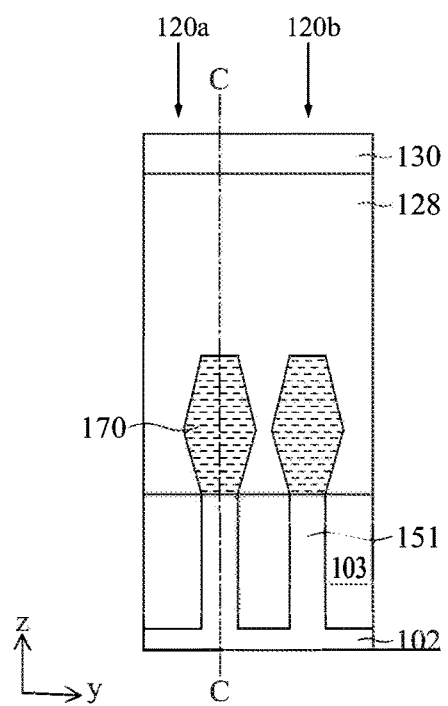
Figure 7C:
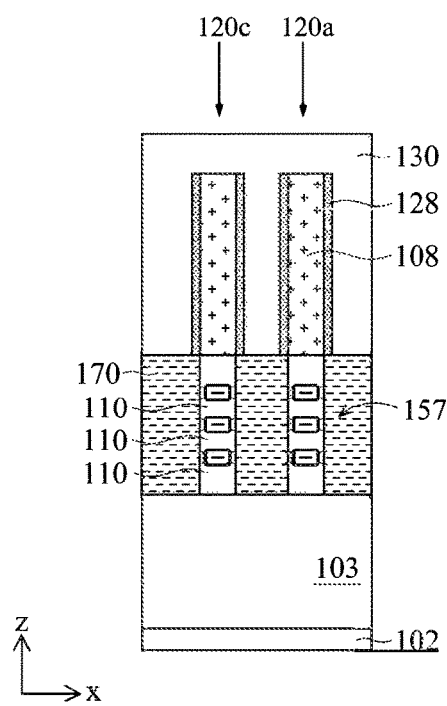

Referring to FIG. 4, in operation 408, epitaxial source/drain regions are formed on either side of sacrificial structure 107. For example, as shown in FIGS. 7A-7C, epitaxial source/drain regions 170 are grown from nanostructured layers 121 and/or 122 of superlattice structures 155 under sacrificial structure 107 to form epitaxial source/drain regions 170 having an elongated hexagonal shape, as shown in FIGS. 7A and 7B. FIG. 7B is a cross-sectional view along cut line B-B of FIG. 7A. FIG. 7C is a cross-sectional view along cut line C-C of FIG. 7A, across gate structure 108 and through epitaxial source/drain regions 170. Consequently, the cross-sectional view in FIG. 7C shows sidewalls of epitaxial source/drain regions 170, as well as GAA channel region 157 between epitaxial source/drain regions 170. Epitaxial source/drain regions 170 can be doped n-type or p-type, depending on channel doping, well doping within substrate 102, and the type of charge carriers intended for the particular device. In some embodiments, epitaxial source/drain regions 170 are doped with boron. In some embodiments, other p-type dopants can be used, e.g., indium or gallium. In some embodiments n-type dopants (e.g., phosphorous, arsenic, or antimony) can be incorporated into epitaxial source/drain regions 170 for a device of opposite polarity than the examples shown herein. In some embodiments, dopants are incorporated into epitaxial source/drain regions 170 in-situ, during the epitaxial growth process to avoid exposure to a thermal process.

Referring to FIG. 4, in operation 410, inter-layer dielectric (ILD) 130 is deposited, as shown in FIGS. 7A-7C. ILD 130 is an insulating layer that electrically insulates neighboring devices and electrical contacts from one another. ILD 130 can be made of a silicon oxide, for example. ILD 130 can be deposited using a CVD or plasma enhanced CVD (PECVD) process, for example.

Referring to FIG. 4, in operation 412, following the formation of ILD 130, sacrificial structure 107 is removed and replaced with a gate structure 108, as described with respect to FIGS. 8A-8E. In operation 412, nanostructured layers 122 are selectively removed to form gate openings in the channel region. The gate openings are then filled with metal by depositing gate structure 108, to form GAA channel region 157, as shown in FIG. 7C. The remaining nanostructured layers 121 of superlattice structures 155 form nanostructured channels 110 of GAAFETs 120. Each of GAA channel regions 157 can include GAA structures 158 (three shown in FIG. 7C).

FIGS. 8A-8E are magnified views showing operations for forming gate structure 108 and GAA channel region 157, shown in FIG. 7C, according to some embodiments. GAA channel region 157 includes multiple GAA structures 158, which surround channels 110 to control current flow therein. Each GAA structure 158 can be viewed as a radial gate stack that includes, from the outermost layer to the innermost layer, a gate dielectric layer 161, a work function metal layer 162, and a gate electrode 163. Gate electrode 163 is operable to maintain a capacitive applied voltage across nanostructured channels 110. Gate dielectric layer 161 separates the metallic layers of GAA structure 158 from nanostructured channels 110. Inner spacers 164 electrically isolate GAA structure 158 from epitaxial source/drain region 170 and prevent current from leaking out of nanostructured channels 110.

Figures 8A, 8B, 8C:
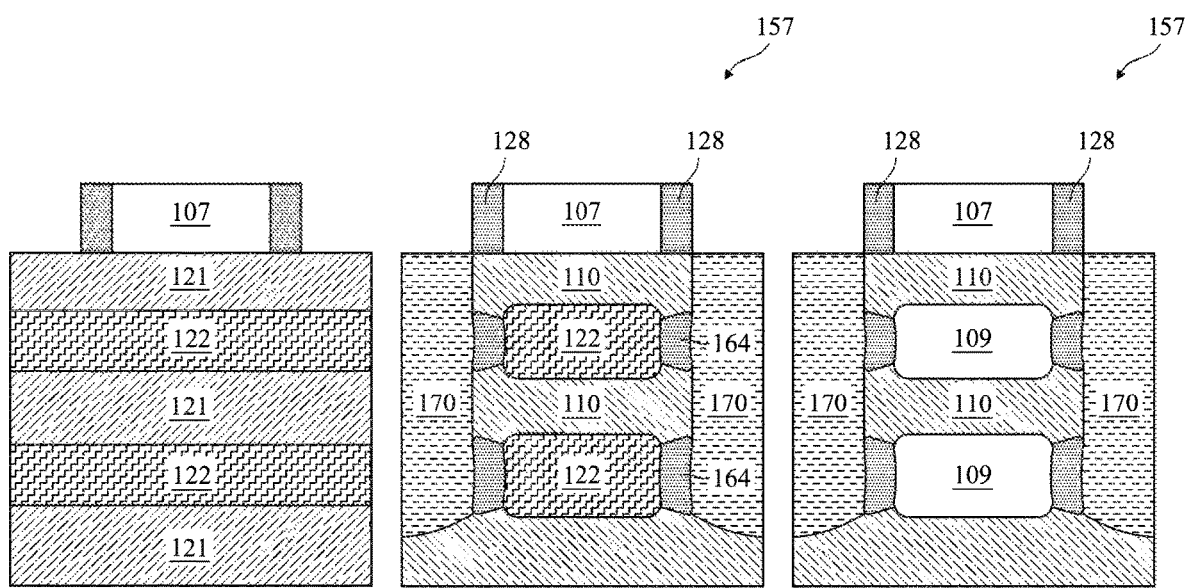

FIG. 8A is a magnified cross-sectional view of superlattice 155 and sacrificial structure 107 shown in FIG. 6C. Superlattice 155 is then etched back, so that the remaining portion of superlattice 155 is in a GAA channel region 157, underneath sacrificial structure 107. Inner spacers 164 are then formed adjacent to nanostructured layers 122 in the GAA channel region 157. Next, epitaxial source/drain regions 170 are grown laterally outward, in the x-direction, from nanostructured layers 121.

FIG. 8B is a magnified cross-sectional view of GAAFET 120, shown in FIG. 7A. FIG. 8B illustrates GAA channel region 157 following formation of inner spacers 164 and epitaxial source/drain regions 170.

FIG. 8C shows GAA channel region 157, following extraction of nanostructured layers 122 and thus forming voids 109.

Figure 8E:
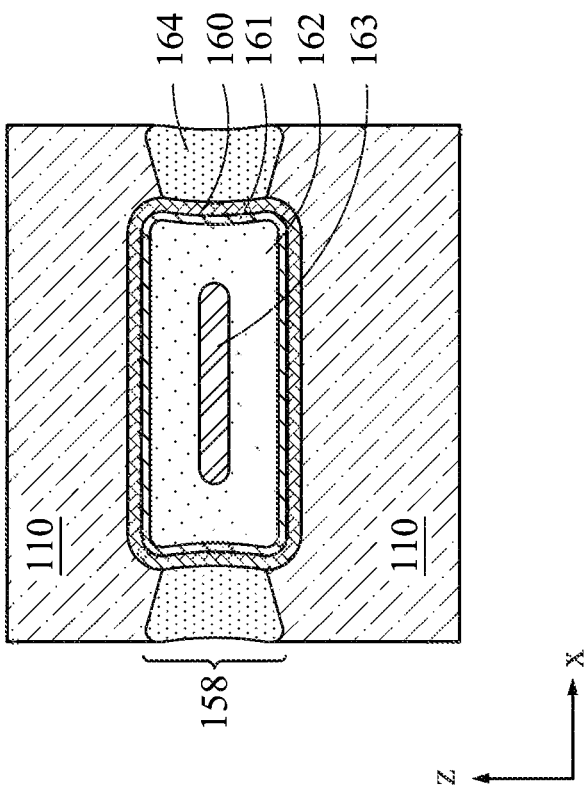
Figure 8D:
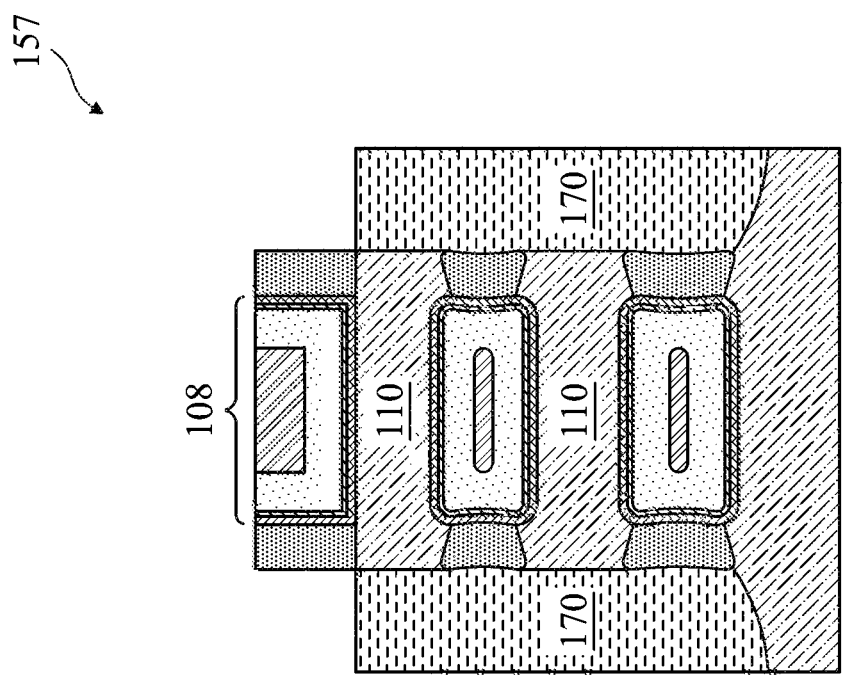

FIG. 8D is a magnified view of GAA channel region 157, shown in FIG. 7C, following replacement of sacrificial structure 107 with gate structure 108. First, sacrificial structure 107 is removed, leaving sidewall spacers in place. Then, gate structure 108 is grown in a multi-step process to form a metal gate stack in place of sacrificial structure 107. Simultaneously, the radial gate stack is formed to fill voids 109 from the outside in, starting with gate dielectric layer 161, and ending with gate electrode 163.

Referring to FIG. 8E, gate dielectric layer 161 can have a thickness between about 1 nm and about 5 nm. Gate dielectric layer 161 can include a silicon oxide and may be formed by CVD, atomic layer deposition (ALD), physical vapor deposition (PVD), e-beam evaporation, or another suitable deposition process. In some embodiments, gate dielectric layer 161 includes a high-k material, wherein the term "high-k" refers to a high dielectric constant. In the field of semiconductor device structures and manufacturing processes, high-k refers to a dielectric constant that is greater than the dielectric constant of $SiO_2$ (e.g., greater than 3.9). In some embodiments, the dielectric layer can include a silicon oxide, silicon nitride, and/or silicon oxynitride material, or a high-k dielectric material, such as hafnium oxide ($HfO_2$). A high-k gate dielectric may be formed by ALD and/or other deposition methods. In some embodiments, the gate dielectric layer can include a single layer or multiple insulating material layers.

Gate work function metal layer 162 can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), cobalt (Co), metal nitrides, metal silicides, metal alloys, and/or combinations thereof. The gate work function metal layer can be formed using a suitable process, such as ALD, CVD, PVD, plating, and combinations thereof. In some embodiments, the gate work function metal layer can have a thickness between about 2 nm and about 15 nm.

Gate electrode 163 may further include a gate metal fill layer. The gate metal fill layer can include a single metal layer or a stack of metal layers. The stack of metal layers can include metals different from each other. In some embodiments, the gate metal fill layer can include one or more suitable conductive materials or alloys, such as Ti, Al, TiN, and the like. The gate metal fill layer can be formed by ALD, PVD, CVD, or other suitable deposition process. Other materials, dimensions, and formation methods for the gate dielectric 161, the gate work function metal layer 162, and the gate electrode 163 are within the scope and spirit of this disclosure.

Figure 9:
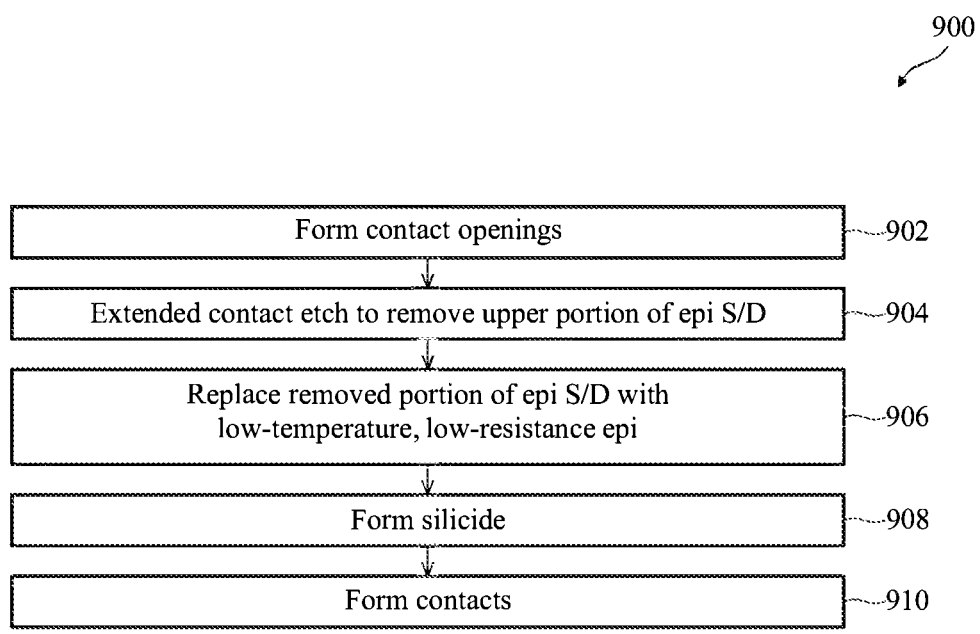
FIG. 9 is a flow diagram of a method for fabricating source/drain contacts to the GAAFET semiconductor devices shown in FIGS. 2B, 2D and 3B, in accordance with some embodiments.

Referring to FIG. 4, in operation 414, contacts to epitaxial source/drain regions 170 of GAAFET 120 are formed. FIG. 9 is a flow diagram of a method 900 for forming contacts to source/drain regions 170, according to some embodiments. For illustrative purposes, the operations illustrated in FIG. 9 will be described with reference to an exemplary process for fabricating low resistance source/drain contacts to GAAFETs 120, as illustrated in FIGS. 10-13, which are isometric and cross-sectional views of GAAFETs 120, at various stages of their fabrication, according to some embodiments. In some embodiments, a similar method 1400, described below with reference to FIGS. 15-18 can be carried out to form contacts to epitaxial source/drain regions 105 of planar FETs 114. In some embodiments, a similar method (not shown) may be carried out to form contacts to epitaxial source/drain regions of FinFET 100. A method similar to method 900 or method 1400 can follow fabrication of other types of semiconductor devices that include epitaxial source/drain regions. Operations of methods 900 and 1400 can be performed in a different order, or not performed, depending on specific applications.

Method 900 includes operations for fabricating low resistance contacts to source/drain regions 170 of GAAFETs 120. Method 900 can be used to reduce both contact resistance ($R_c$) and the source/drain resistance $R_{sd}$. Fabrication operations of method 900 avoid the use of implant processes to boost the active concentration of dopants, e.g., boron, in a p-type source/drain region. Such implant processes can require a subsequent high temperature anneal to heal damage to the doped film and to activate the dopants. Use of a high temperature anneal operation is undesirable, and in some cases, incompatible with other process improvements that may be implemented in fabricating semiconductor devices, such as GAAFETs 120. It may be detrimental to subject semiconductor devices to high temperatures during contact formation, after transistors are formed. For example, high temperature processing can degrade strain on channels 110 that is imparted by epitaxial source/drain regions 170 for the purpose of increasing carrier mobility.

Figure 10:
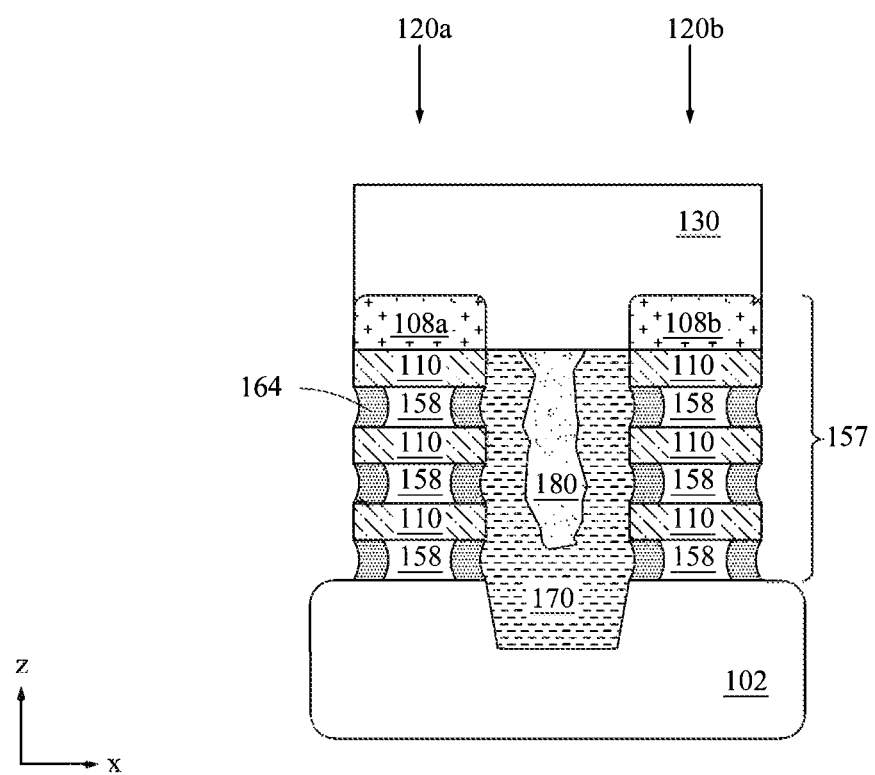
FIGS. 10-13 are cross-sectional views of source/drain contacts of GAAFETs at various stages of their fabrication process, in accordance with some embodiments.

Referring to FIG. 9, the starting device structure for method 900 is shown in FIG. 10 for GAAFETs 120a and 120b. In FIG. 10, two adjacent gate structures 108a and 108b are shown, sharing source/drain regions 170, and covered by ILD 130, which is formed as part of method 400. GAAFETs 120, shown in FIG. 10, include adjacent GAA channel regions 157 as described above, which share a common source/drain region 170. In some embodiments, source/drain region 170 can include an inner core 180 made of a lower resistivity material than source/drain region 170. In some embodiments, the volume of narrow inner core 180 is insufficient to substantially lower the contact resistance of a subsequently formed source/drain contact.

Figure 11:
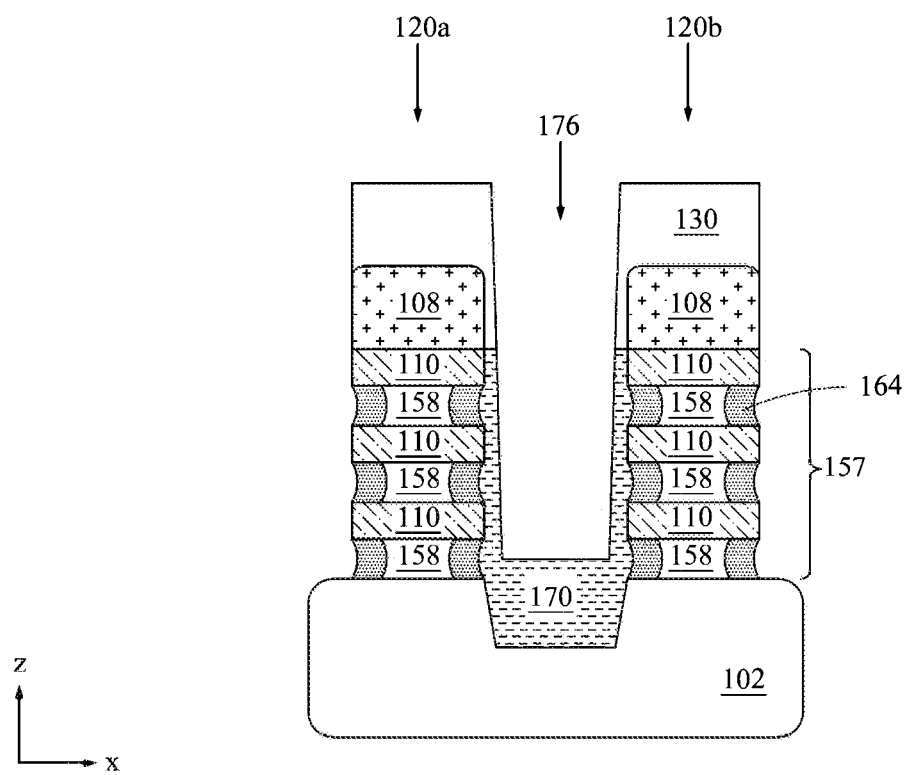

Referring to FIG. 9, in operation 902, source/drain contact openings 176 are formed as shown in FIG. 11 with respect to exemplary GAAFETs 120a and 120b. The process of forming source/drain contact openings 176 can include removing portions of ILD 130 over source/drain regions 170. The process of removing portions of ILD 130 can include patterning, using photolithography to expose areas of ILD 130 to be removed. Source/drain contact openings 176 can be formed by removing exposed areas of ILD 130 using a fluorine-based dry etching process.

Referring to FIG. 9, in operation 904, an extended contact etch is performed to remove an upper portion of epitaxial source/drain region 170, as shown in FIG. 11. Over-etching source/drain contact openings 176 can continue vertically downward, in the z-direction, into epitaxial source/drain regions 170, in some embodiments, to a depth of about 5 nm to about 40 nm, so as to remove a substantial portion, if not the majority, of inner core 180. Following the main contact etch and over-etch operations, about 10 nm to about 30 nm thickness of source/drain region 170 remains, so that a significant volume of inner core 180 (e.g., SiGeB) has been removed.

Figure 12:
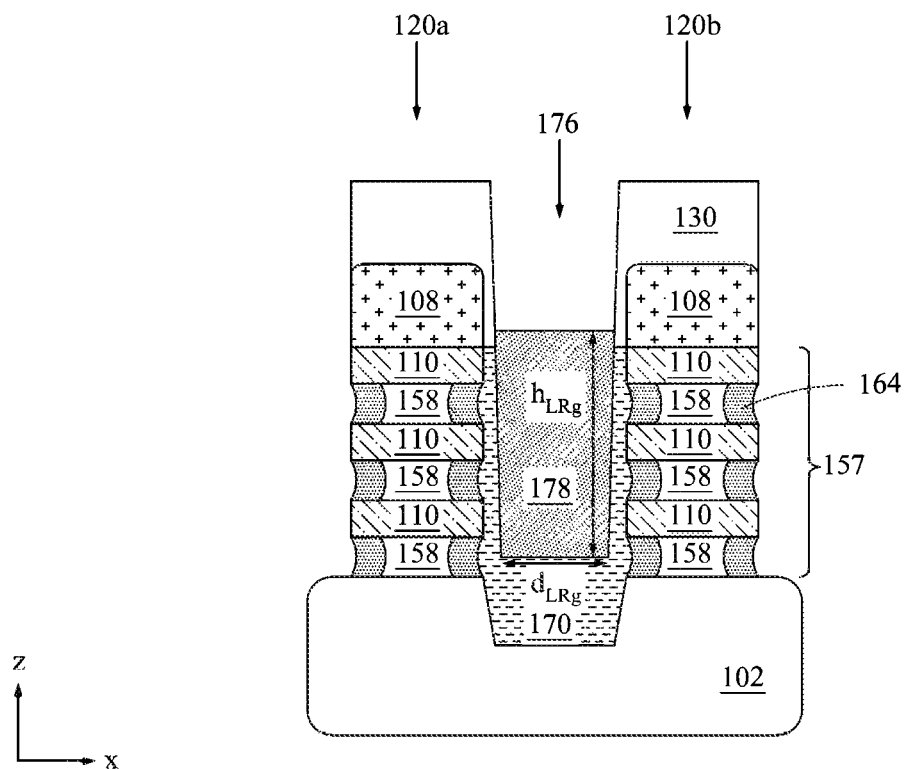

Referring to FIG. 9, in operation 906, a low temperature, low resistance (LT/LR) contact layer 178 is formed, as illustrated in FIG. 12, with respect to exemplary GAAFETs 120a and 120b. LT/LR contact layer 178 has a lower resistivity than source/drain regions 105 and 170. In some embodiments, the source/drain material (e.g., SiGeB) that was removed in operation 904 is replaced with LT/LR contact layer 178. In some embodiments, LT/LR contact layer 178 can include a similar material with similar doping, e.g., SiGeB as the removed material. LT/LR contact layer 178 can be an epitaxial layer a layer that is epitaxially grown using one or more precursor gases, such as silane ($SiH_4$), di-silane ($Si_2H_6$), germane ($GeH_4$), and di-germane ($Ge_2H_6$). In some embodiments, LT/LR contact layer 178 has a germanium concentration between about 55% and about 65%.

Resistivity of LT/LR contact layer 178 can be tuned by varying the temperature during the epitaxy process. In some embodiments, epitaxial growth of SiGeB as LT/LR contact layer 178 can occur in a chamber at a deposition temperature of about 300° C. to about 450° C., so as to produce a SiGeB LT/LR contact layer 178 having a resistivity between about 0.18 mΩ-cm and about 0.22 mΩ-cm. LT/LR contact layer 178 can be grown to a thickness such that a top surface of LT/LR contact layer 178 extends above a top layer of GAA channel region 157, to compensate for consumption of LT/LR contact layer 178 in a subsequent silicidation process, as described below. In some embodiments, improved device performance attributable to LT/LR contact layer 178 can be primarily due to the significant volume of the source/drain replaced by LT/LR contact layer 178.

LT/LR contact layer 178 can be doped in-situ during the epitaxy process. In some embodiments, the doping concentration of boron may be different from the SiGeB that was removed. In some embodiments, the doping concentration of boron is greater in LT/LR contact layer 178 than in source/drain region 105. For example, the boron concentration in LT/LR contact layer 178 can be between $5 \times 10^{20}$ $cm^{-3}$ and about $2 \times 10^{21}$ $cm^{-3}$, compared with a boron concentration of about $6 \times 10^{20}$ $cm^{-3}$ in source/drain region 105. The concentration of boron dopants in the LT/LR contact layer 178 (e.g., which includes SiGeB) in source/drain region 105 may influence the resistivity of LT/LR contact layer 178.

Figure 13:
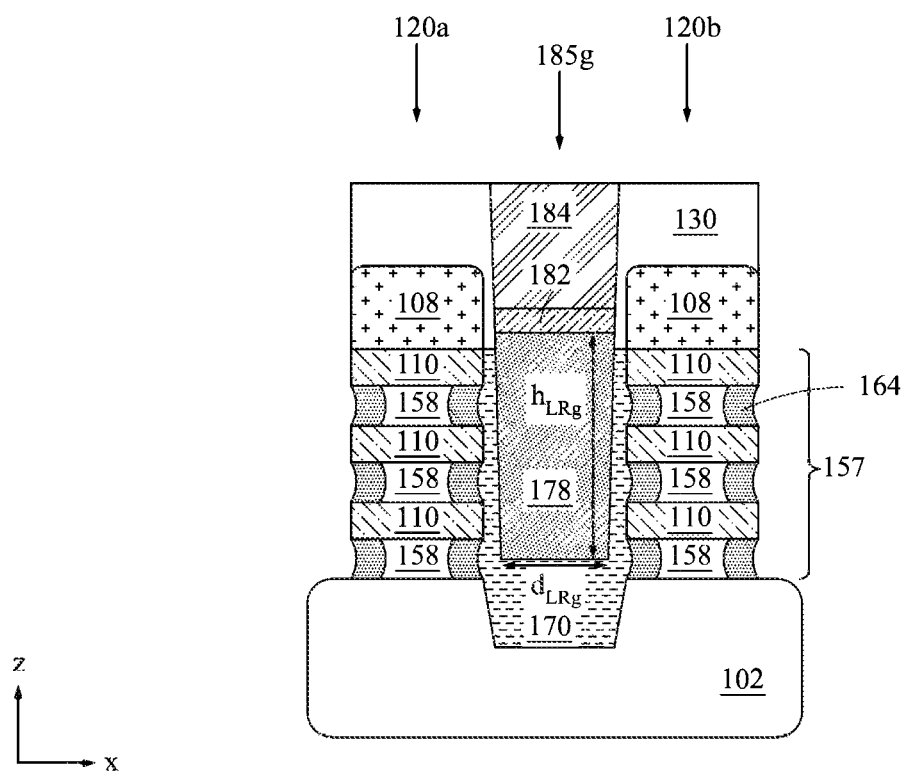

Referring to FIG. 9, in operation 908, a silicide layer 182 is formed as illustrated in FIG. 13, with respect to GAAFETs 120a and 120b. Silicide layer 182 can be formed by reacting a top surface of the SiGeB source/drain region 105 with a low resistivity metal, such as tungsten, ruthenium, titanium, nickel, and cobalt, to form a metal silicide, e.g., WSi, RuSi, TiSi, NiSi, and CoSi, respectively. In some embodiments, the low resistivity metal is deposited by ALD or CVD. The silicide may form diffusion barrier layers along surfaces of source/drain contact openings 176. During the silicidation process, a top portion of LT/LR contact layer 178 can be consumed such that the top surface of LT/LR contact layer 178 is lowered to approximately the bottom of sidewall spacer 128. Silicide layer 182 can have a thickness between about 5 nm and about 15 nm. The doping concentration of boron in LT/LR contact layer 178 (e.g., which includes SiGeB) in source/drain region 105 may influence the resistivity of silicide layer 182.

Referring to FIG. 9, in operation 910, source/drain contact 185g is formed as illustrated in FIG. 13, with respect to GAAFETs 120a and 120b. Source/drain contacts 185g include a contact metal 184, e.g., copper (Cu), aluminum (Al), tungsten (W), cobalt (Co), titanium (Ti) or the like, or a metal alloy, or a stack of various metals or metal alloys that may include layers, such as TiN. The process of forming source/drain contacts 185g can include deposition of contact metal 184 using, for example, a PVD, CVD, or ALD process, followed by a polishing process to co-planarize top surfaces of the contact metal 184 with top surfaces of ILD 130. Contact metal 184 can have a top contact diameter between about 8 nm and about 30 nm, which determines a contact area available to make electrical contact with integrated circuit wiring (not shown). The polishing process can be a chemical-mechanical planarization (CMP) process. In some embodiments, the CMP process can use a silicon or an aluminum abrasive slurry having abrasive concentrations between about 0.1% and about 3%. In some embodiments, the abrasive slurry may have a pH level less than 7, for example, when W is used as the contact metal 184. Alternatively, the abrasive slurry can have a pH level greater than 7, for example, when Co or Cu is used as contact metal 184.

In GAAFETs 120a and 120b, a significant volume of the epitaxial source/drain region 170 can be replaced by LT/LR contact layer 178. Consequently, the remaining volume occupied by contact metal 184 in source/drain contact 185g can be smaller than a corresponding volume of contact metal 184 in source/drain contact 185f of planar FETs 114a and 114b, as described below. For example, a large volume of LT/LR contact layer 178 can have a diameter $d_{LRg}$ between about 8 nm and about 30 nm, a height $h_{LRg}$ between about 5 nm and about 40 nm, and a tapered profile having a profile angle between about 75 degrees and 89 degrees. The dimensions of LT/LR contact layer 178 in GAAFETs 120a and 120b can therefore be larger than corresponding dimensions $d_{LRf}$ and $h_{LRf}$ of LT/LR contact layer 178 in planar FETs 114a and 114b. In some embodiments, the reduction in contact resistance scales with the volume of LT/LR contact layer 178. In some embodiments, the LT/LR contact layer has an aspect ratio of height to diameter greater than about 1. In some embodiments, an aspect ratio $h_{LRf}/d_{LRf}$ of contact layer 178 in planar FETs 114a, 114b can be between about 0.8 and about 1.2, whereas an aspect ratio $h_{LRg}/d_{LRg}$ of contact layer 178 in GAAFETs 120a, 120b can be between about 1.0 and about 4.0. In GAAFETs 120a and 120b, the original epitaxial source/drain region 170, which is adjacent to GAA channel regions 157, may assume the shape of inner spacers 164, which can be curved. As a result, in some embodiments, the epitaxial source/drain region 170 can have a scalloped profile. In some embodiments, a top surface of the original epitaxial source/drain region 170 can be approximately co-planar with uppermost channels 110, whereas LT/LR contact layer 178 can extend above channel regions 157.

Method 1400 includes operations for fabricating low resistance contacts to epitaxial source/drain regions 105 of planar FETs 114. Method 1400 can be used to reduce both contact resistance (Re) and the source/drain resistance $R_{sd}$. Fabrication operations of method 1400 avoid the use of implant processes to boost the active concentration of dopants, e.g., boron, in a p-type source/drain region. Such implant processes could require a subsequent high temperature anneal to heal damage to the doped film and to activate the dopants. Use of a high temperature anneal operation is undesirable, and in some cases, incompatible with other process improvements that may be implemented in fabricating semiconductor devices, such as planar FETs 114. It may be detrimental to subject semiconductor devices to high temperatures during contact formation, after transistors are formed. For example, high temperature processing can degrade strain on channels 110 that is imparted by epitaxial source/drain regions 105 for the purpose of increasing carrier mobility.

Figure 14:
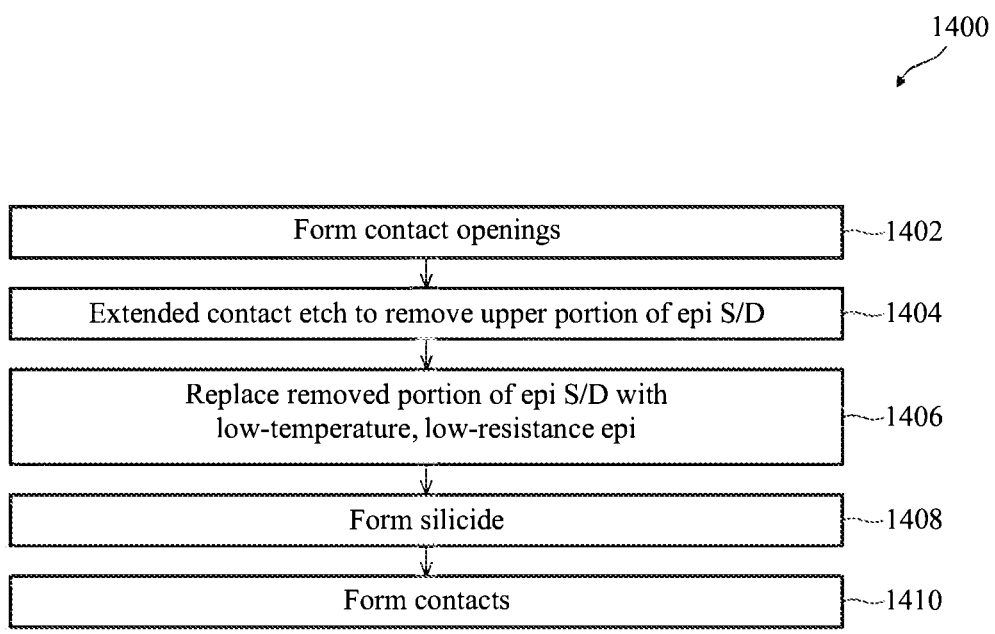
FIG. 14 is a flow diagram of a method for fabricating source/drain contacts to the semiconductor devices shown in FIGS. 2A and 2B, in accordance with some embodiments.
Figure 15:
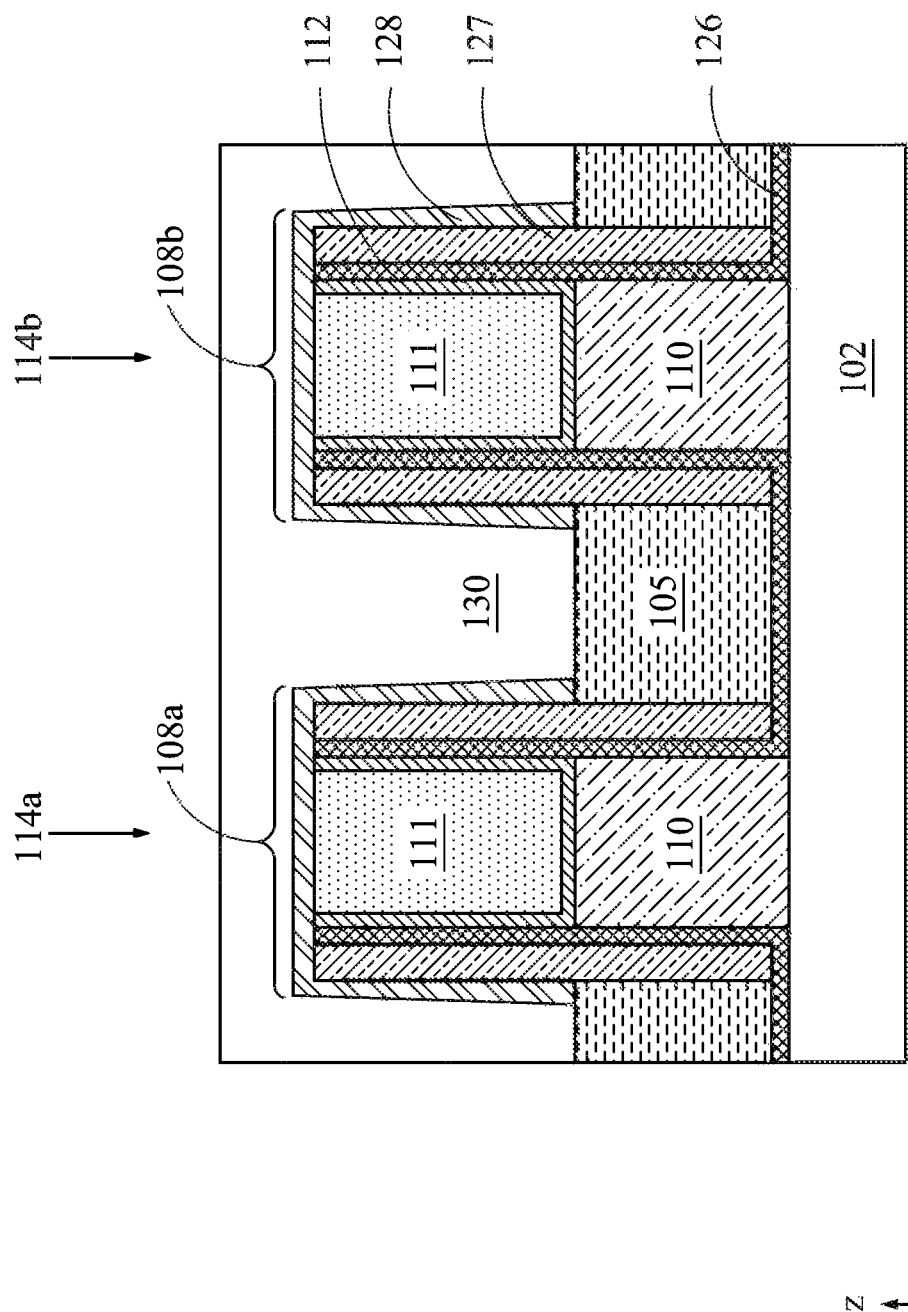
FIGS. 15-18 are cross-sectional views of source/drain contacts of planar FETs at various stages of their fabrication process, in accordance with some embodiments.

Referring to FIG. 14, the starting device structure for method 1400 is shown in FIG. 15, for planar FETs 114a and 114b, respectively. In FIG. 15, two adjacent gate structures 108, 108a and 108b, are shown, sharing source/drain regions 170, and covered by ILD 130, which is formed as part of method 400. In each of planar FETs 114a and 114b, corresponding gate structures 108a and 108b include a channel 110, gate electrode 111, gate dielectric 112, spacer layers 127 and 128, and liner 126.

Figure 16:
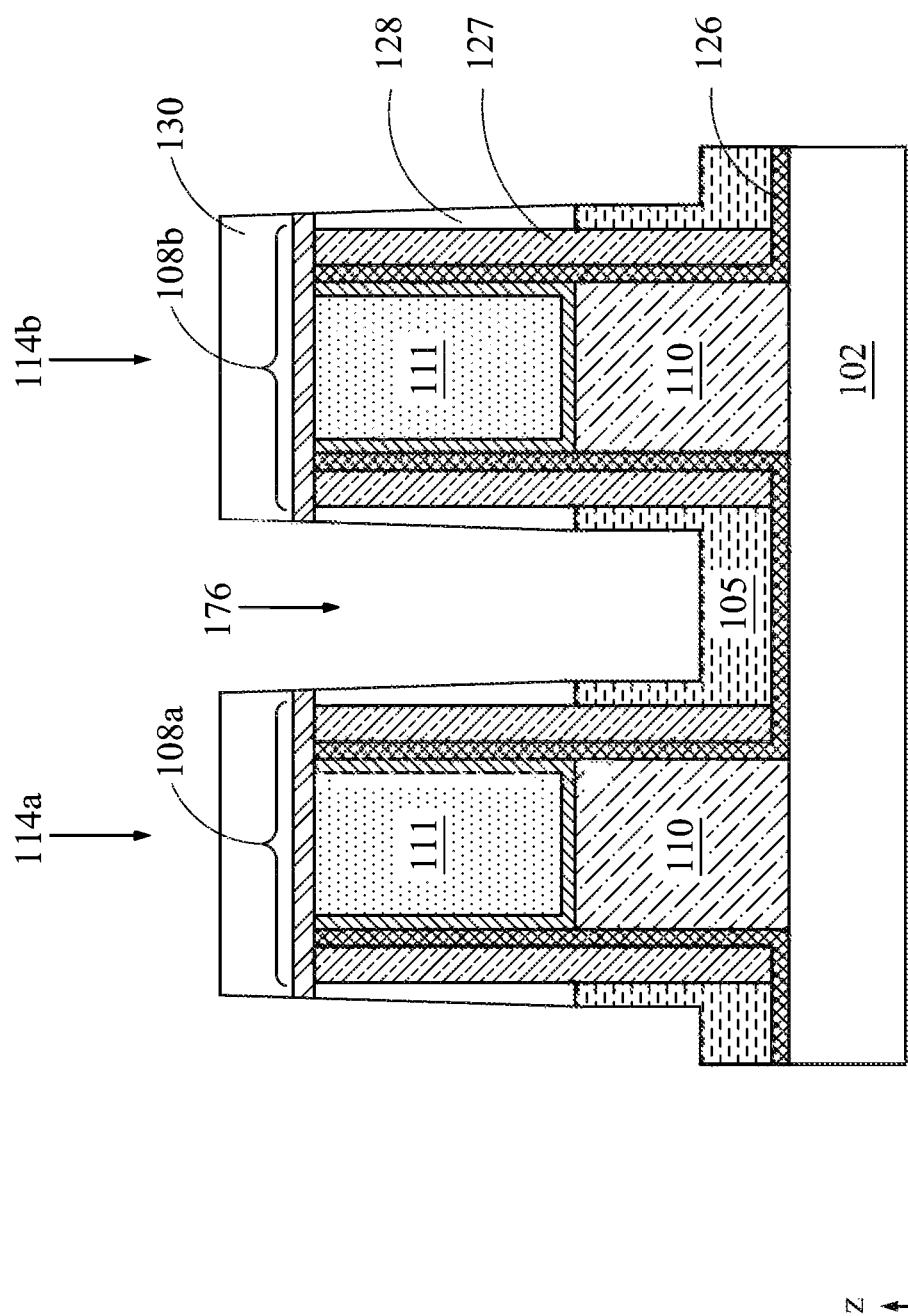

Referring to FIG. 14, in operation 1402, source/drain contact openings 176 are formed as shown in FIG. 16 with respect to exemplary planar FETs 114a and 114b. The process of forming source/drain contact openings 176 can include removing portions of ILD 130 over source/drain regions 105. The process of removing portions of ILD 130 can include patterning, using photolithography to expose areas of ILD 130 to be removed. Source/drain contact openings 176 can be formed by removing exposed areas of ILD 130 using a fluorine-based dry etching process. Source/drain contact openings 176 can extend laterally, in the x-direction, to sidewall portions of spacer layers 128, such that the ILD between adjacent gate structures is consumed during a main etching operation.

Referring to FIG. 14, in operation 1404, an extended contact etch is performed to remove an upper portion of epitaxial source/drain region 105, as shown in FIG. 16. Over-etching source/drain contact openings 176 can continue vertically downward, in the z-direction, into epitaxial source/drain regions 105, in some embodiments, to a depth of about 10 nm to about 20 nm, so as to remove a substantial portion, if not the majority, of the epitaxial material. Following the main contact etch and over-etch operations, about 10 nm to about 30 nm thickness of source/drain region 105 remains, so that a significant volume of the material (e.g., SiGeB) has been removed.

Figure 17:
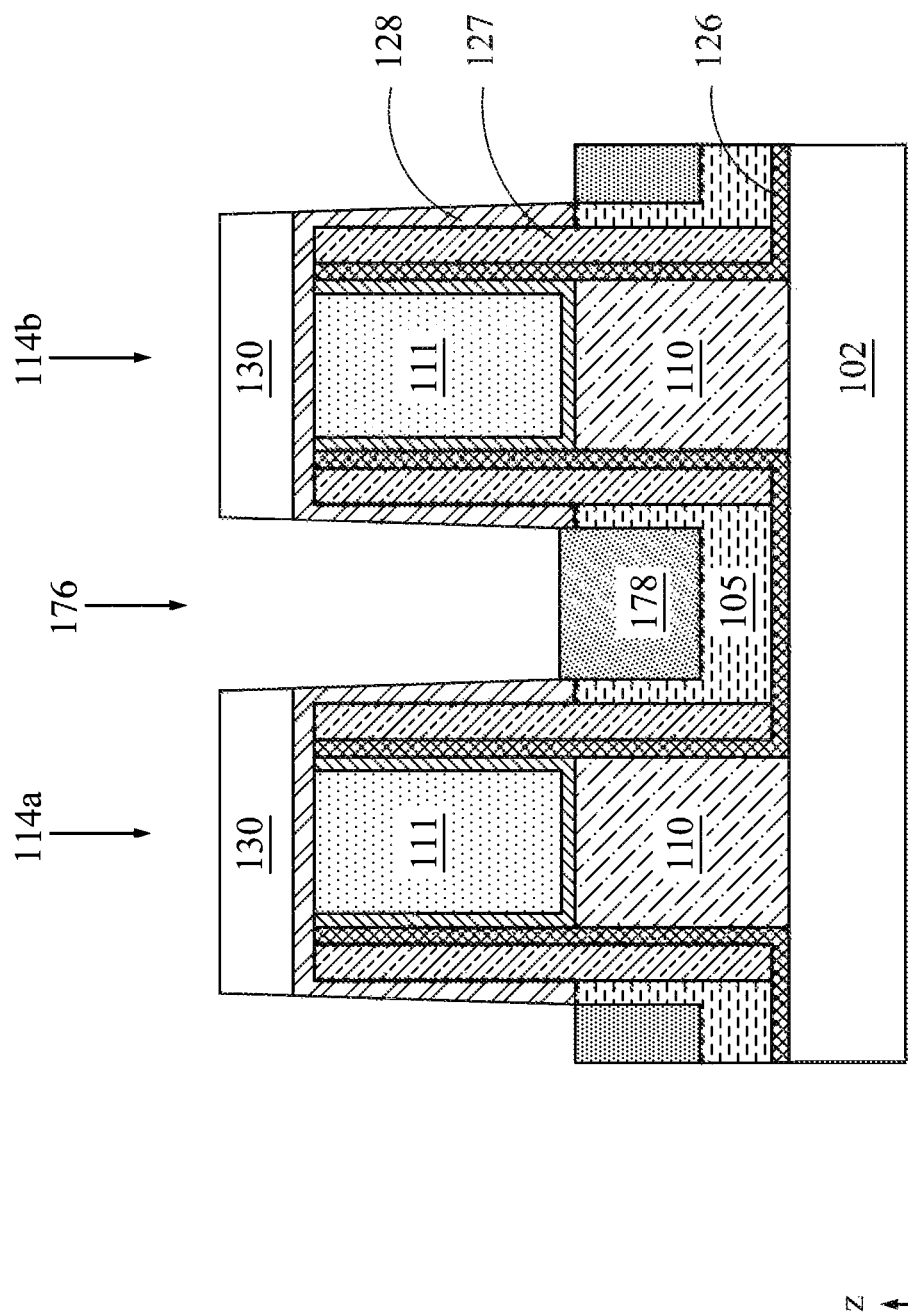

Referring to FIG. 14 in operation 1406, a LT/LR contact layer 178 is formed, as illustrated in FIG. 17, with respect to exemplary planar FETs 114a and 114b. LT/LR contact layer 178 has a lower resistivity than source/drain region 105. In some embodiments, the source/drain material (e.g., SiGeB) that was removed in operation 1404 is replaced with LT/LR contact layer 178. In some embodiments, LT/LR contact layer 178 can include SiGeB. LT/LR contact layer 178 can be an epitaxial layer—a layer that is epitaxially grown using one or more precursor gases, such as silane ($SiH_4$), di-silane ($Si_2H_6$), germane ($GeH_4$), and di-germane ($Ge_2H_6$). In some embodiments, LT/LR contact layer 178 has a germanium concentration between about 55% and about 65%.

In some embodiments, epitaxial growth of SiGeB as LT/LR contact layer 178 can occur in a chamber at a deposition temperature of about 300° C. to about 450° C., so as to produce a SiGeB LT/LR contact layer 178 having a resistivity between about 0.18 mΩ-cm and about 0.22 mΩ-cm. LT/LR contact layer 178 can be grown to a thickness such that a top surface of LT/LR contact layer 178 is above a bottom of sidewall spacer 128, to compensate for erosion of LT/LR contact layer 178 in a subsequent silicidation process, as described below. In some embodiments, improved device performance attributable to LT/LR contact layer 178 can be primarily due to the significant volume of the source/drain replaced by LT/LR contact layer 178.

LT/LR contact layer 178 can be doped in-situ during the epitaxy process. In some embodiments, the doping concentration of boron may be different from the SiGeB that was removed. In some embodiments, the doping concentration of boron is greater in LT/LR contact layer 178 than in source/drain region 105. For example, the boron concentration in LT/LR contact layer 178 can be between $5 \times 10^{20}$ cm$^{-3}$ and about $2 \times 10^{21}$ cm$^{-3}$, compared with a boron concentration of about $6 \times 10^{20}$ cm$^{-3}$ in source/drain region 105. The concentration of boron dopants in the LT/LR contact layer 178 (e.g., which includes SiGeB) in source/drain region 105 may influence the resistivity of LT/LR contact layer 178.

Figure 18:
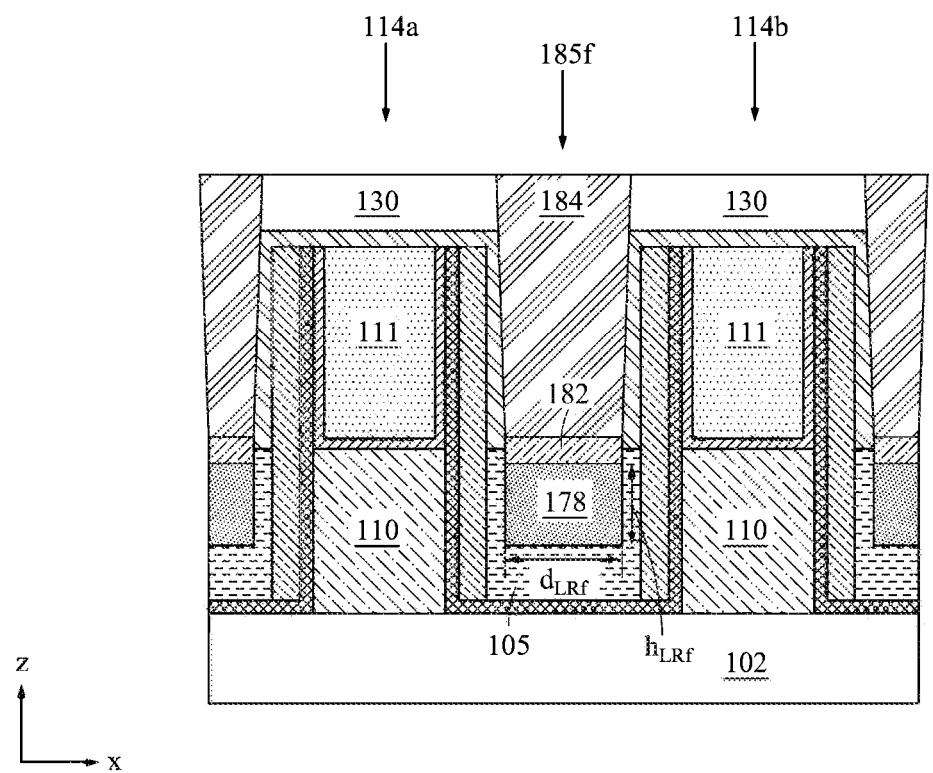

Referring to FIG. 14, in operation 1408, a silicide layer 182 is formed as illustrated in FIG. 18, with respect to planar F 114a and 114b. Silicide layer 182 can be formed by reacting atop surface of the SiGeB source/drain region 105 with a low resistivity metal, such as tungsten, ruthenium, titanium, nickel, and cobalt, to form a metal silicide, e.g., WSi, RuSi, TiSi, NiSi, and CoSi, respectively. In some embodiments, the low resistivity metal is deposited by ALD or CVD. The silicide may form diffusion barrier layers along surfaces of source/drain contact openings 176. During the silicidation process, a top portion of LT/LR contact layer 178 can be consumed such that the top surface of LT/LR contact layer 178 is lowered to approximately the bottom of sidewall spacer 128. Silicide layer 182 can have a thickness between about 5 nm and about 15 nm. The doping concentration of boron in LT/LR contact layer 178 (e.g., which includes SiGeB) in source/drain region 105 may influence the resistivity of silicide layer 182.

Referring to FIG. 14, in operation 1410, source/drain contact 185f is formed as illustrated in FIG. 18, with respect to planar FETs 114a and 114b. Source/drain contact 185f includes a contact metal 184, e.g., copper (Cu), aluminum (Al), tungsten (W), cobalt (Co), titanium (Ti) or the like, or a metal alloy, or a stack of various metals or metal alloys that may include layers, such as TiN. The process of forming source/drain contact 185f can include deposition of contact metal 184 using, for example, a PVD, CVD, or ALD process, followed by a polishing process to co-planarize top surfaces of the contact metal 184 with top surfaces of ILD 130. Contact metal 184 can have a top contact diameter between about 8 nm and about 30 nm, which determines a contact area available to make electrical contact with integrated circuit wiring (not shown). The polishing process can be a chemical-mechanical planarization (CMP) process. In some embodiments, the CMP process can use a silicon or an aluminum abrasive slurry having abrasive concentrations between about 0.1% and about 3%. In some embodiments, the abrasive slurry may have a pH level less than 7, for example, when W is used as the contact metal 184. Alternatively, the abrasive slurry can have a pH level greater than 7, for example, when Co or Cu is used as contact metal 184.

In some embodiments, methods 900 and 1400 remove a source/drain epitaxial material and replace the removed material with an LT/LR material at a point in the overall process where the LT/LR material will not be exposed to a high temperature processing environment that could cause damage to the LT/LR material or degrade its performance. Such a high temperature processing environment may exist, for example, during formation of high dielectric constant layers.

Figure 19A:
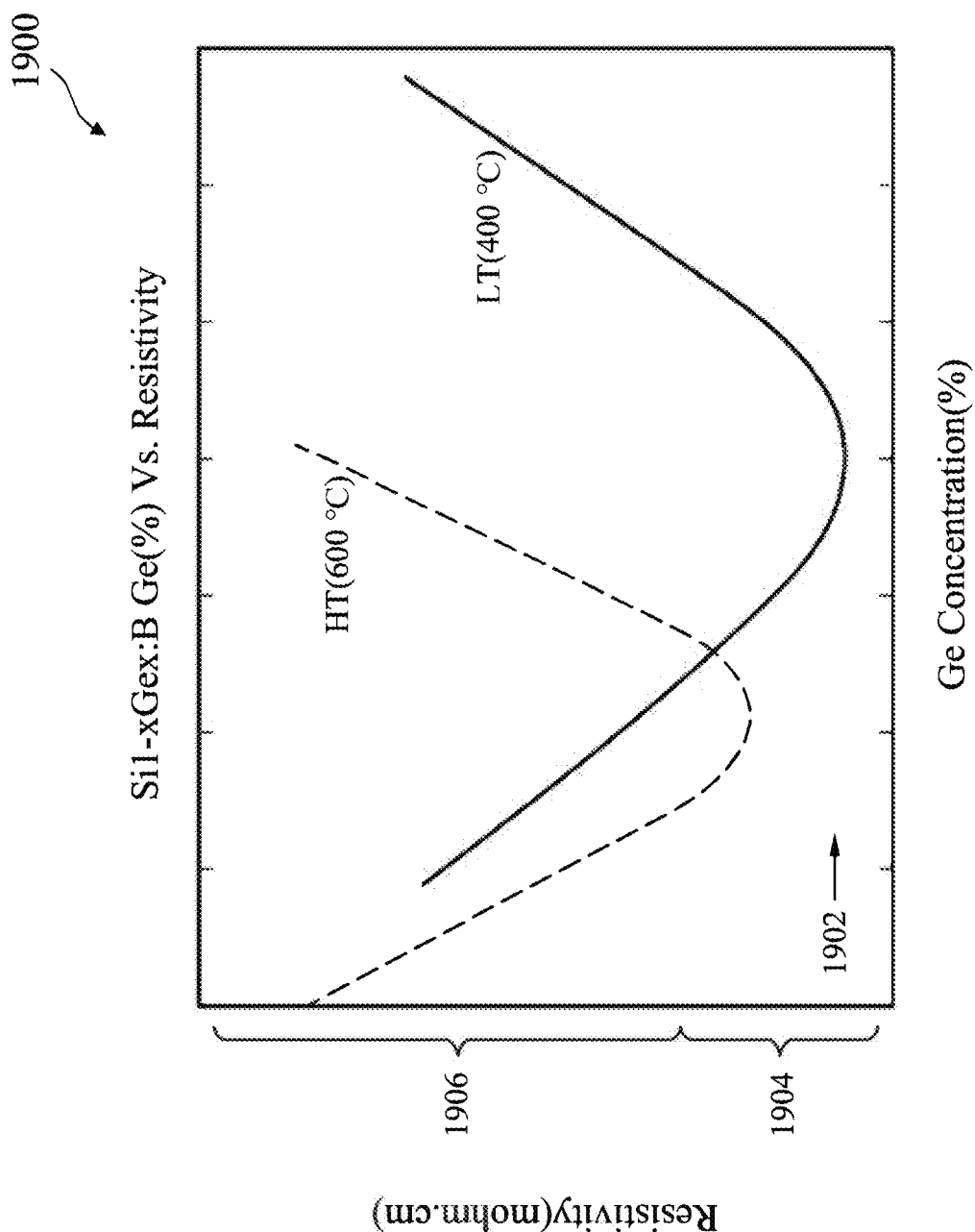
FIGS. 19A and 19B are graphs illustrating relationships between resistivity, concentration, and temperature, in accordance with some embodiments.
Figure 19B:
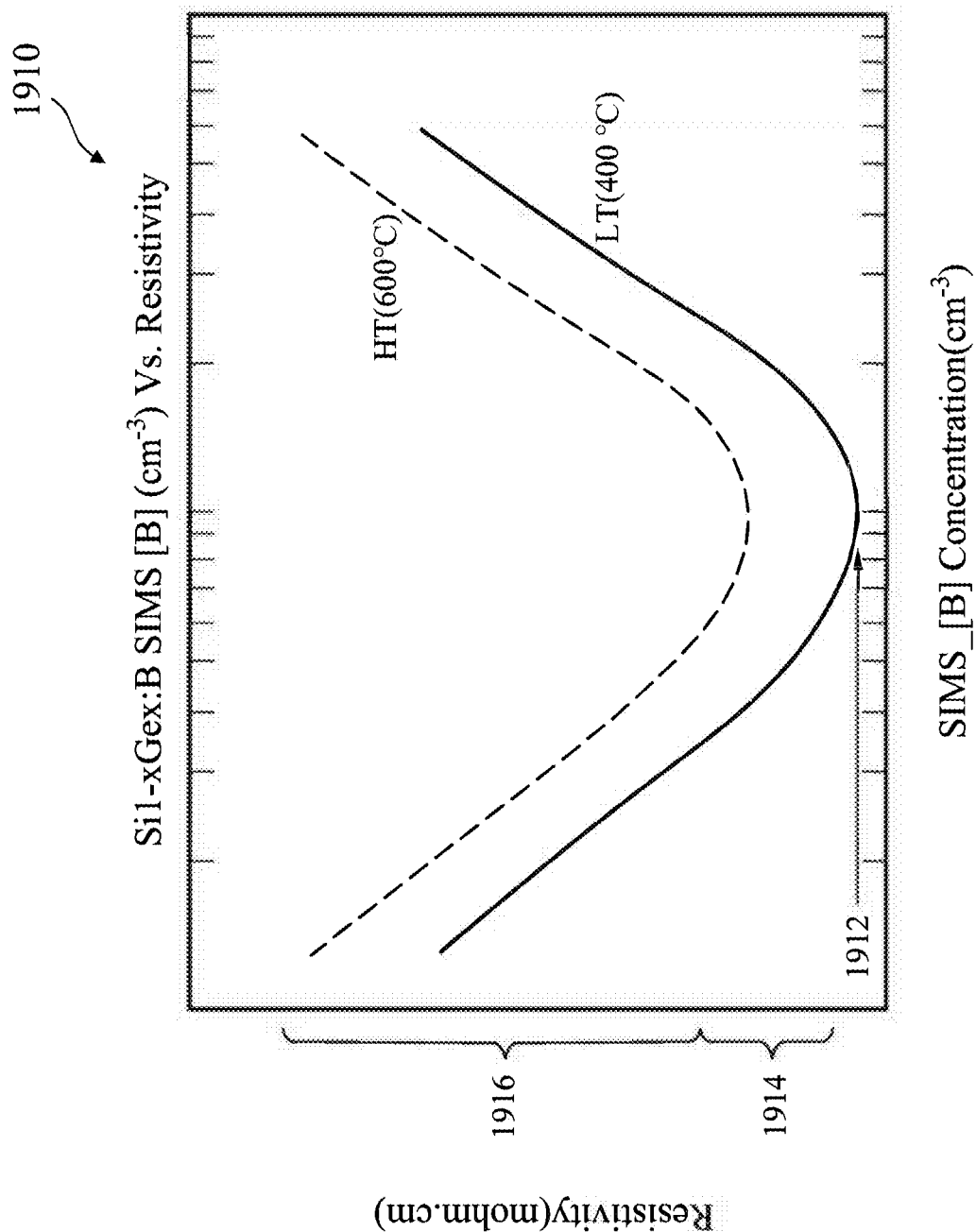

Referring to FIGS. 19A and 19B, plots 1900 and 1910 of resistivities are given as a function of concentration for various process temperatures. FIG. 19A is a Secondary Ion Mass Spectrometry (SIMS) plot 1900 of resistivity vs. germanium concentration of an epitaxial boron-doped silicon germanium (SiGeB) material deposited at temperatures between about 400° C. and about 600° C. FIG. 19B is a SIMS plot 1910 of resistivity vs. boron concentration of a SiGeB material deposited at temperatures between about 400° C. and about 600° C. SIMS is a measurement technique for determining the chemical composition of surfaces and thin films by sputtering using an ion beam. SIMS is capable of detecting low concentrations of dopants and impurities. In FIG. 19A, resistivity data 1902 indicates that the lowest resistivity is achieved when the germanium concentration is between about 50% and about 70% and when the process temperature for the epitaxial growth process is the lowest (e.g., about 400° C.). As the temperature is increased, crystal defects start to appear in the epitaxial film, causing the resistivity to increase. Resistivities 1904 remain low as the process temperature is increased to about 560° C., but degrade substantially (1906) as the temperature is raised to about 600° C. Similar groups resistivity trends 1912, 1914, and 1916 are shown in FIG. 19B for boron concentration.

Epitaxial structures are used to reduce source/drain contact resistance of semiconductor devices, such as planar FETS, FinFETs and GAAFETs. The epitaxial structures include epitaxial source/drain regions. After the semiconductor device is formed, an upper portion of the source/drain region is removed and replaced with a lower resistivity material, to which an electrical contact is made. In some embodiments, the replacement material is boron-doped SiGe having more than 50% germanium content and a doping concentration that exceeds $1 \times 10^{21}$ cm$^{-3}$. The replacement material can be grown epitaxially at a temperature below 450° C. In some embodiments, the decrease in contact resistance scales with the volume of the source/drain material being replaced.

In some embodiments, a method includes: forming a source/drain region on a fin structure on a substrate; depositing an insulating layer over the source/drain region; removing a portion of the insulating layer and a portion of the source/drain region to form an opening; forming an epitaxial layer in the opening, the epitaxial layer having a diameter and a height that exceeds the diameter; forming a silicide layer on the epitaxial layer; and depositing a metal on the silicide layer.

In some embodiments, a method includes: forming a fin structure on a substrate; forming, on the fin structure, a superlattice structure with nanostructured layers; forming a gate structure surrounding a channel region of the superlattice structure; replacing a source/drain region of the superlattice structure with a first source/drain material, where the source/drain region of the superlattice structure is adjacent to the channel region of the superlattice structure surrounded by the gate structure; replacing a portion of the first source/drain material with a second source/drain material having a lower resistivity than the first source/drain material; forming a silicide layer on the second source/drain material; and depositing a metal on the silicide layer.

In some embodiments, a semiconductor structure includes: a fin structure on a substrate; a source/drain region on the fin structure, where an upper portion of the source/drain region includes a first semiconductor material different from a second semiconductor material in a lower portion of the source/drain region, the first and second semiconductor materials having a similar composition with different p-type doping concentrations; a silicide layer on the first semiconductor material; and a metal on the silicide layer.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a fin structure on a substrate;
    a source/drain region on the fin structure, wherein an upper portion of the source/drain region comprises a first semiconductor material different from a second semiconductor material in a lower portion of the source/drain region, the first and second semiconductor materials having a similar composition with different p-type doping concentrations;
    a silicide layer on the first semiconductor material; and
    a metal on the silicide layer, wherein a side surface of the metal is coplanar with a side surface of the upper portion of the source/drain region.

2. The semiconductor structure of claim 1, wherein the first semiconductor material has a lower resistivity than the second semiconductor material.

3. The semiconductor structure of claim 1, wherein the first semiconductor material comprises silicon germanium.

4. The semiconductor structure of claim 1, wherein the first semiconductor material comprises one or more of boron, indium, and gallium.

5. The semiconductor structure of claim 1, wherein the upper portion of the source/drain region has a tapered profile with a profile angle between about 75 and about 90 degrees.

6. The semiconductor structure of claim 1, wherein the first and second semiconductor materials are epitaxial layers.

7. The semiconductor structure of claim 1, wherein a volume of the first semiconductor material is larger than a volume of the second semiconductor material.

8. The semiconductor structure of claim 1, wherein the metal has a top contact diameter between about 8 nm and about 30 nm.

9. A semiconductor structure, comprising:
    a fin structure on a substrate;
    a channel region in the fin structure;
    an epitaxial source/drain (S/D) region adjacent to the channel region;

an epitaxial S/D contact layer on the epitaxial S/D region, wherein a doping concentration of the epitaxial S/D contact layer is greater than a doping concentration of the epitaxial S/D region; and a silicide layer on the epitaxial S/D contact layer, wherein a top surface of the epitaxial S/D region is above a top surface of the epitaxial S/D contact layer and below a top surface of the silicide layer.

10. The semiconductor structure of claim 9, wherein a top surface of the epitaxial S/D contact layer is above a top surface of the channel region.

11. The semiconductor structure of claim 9, wherein an interface between the epitaxial S/D contact layer and the epitaxial S/D region is substantially perpendicular to a bottom surface of the epitaxial S/D contact layer.

12. The semiconductor structure of claim 9, wherein a ratio of a thickness of epitaxial S/D contact layer to a width of epitaxial S/D contact layer is between about 0.8 and about 1.2.

13. The semiconductor structure of claim 9, wherein the epitaxial S/D contact layer and the epitaxial S/D region comprise an epitaxial boron doped silicon germanium material.

14. The semiconductor structure of claim 9, wherein a width of a horizontal interface between the silicide layer and the epitaxial S/D contact layer is greater than a width of a bottom surface of the epitaxial S/D contact layer.

15. A semiconductor structure, comprising:
a fin structure on a substrate;
a gate structure over the fin structure;
a spacer layer on a side surface of the gate structure; and
a source/drain (S/D) contact structure in contact with the spacer layer, wherein the S/D contact structure comprises:
an epitaxial S/D region in the fin structure;
an epitaxial S/D contact layer on the epitaxial S/D region, wherein a resistivity of the epitaxial S/D contact layer is less than a resistivity of the epitaxial S/D region; and
a silicide layer on the epitaxial S/D contact layer, wherein a first distance between a bottom surface of the silicide layer and a bottom surface of the epitaxial S/D contact layer is greater than a second distance between side surfaces of the epitaxial S/D contact layer.

16. The semiconductor structure of claim 15, wherein the resistivity of the epitaxial S/D contact layer is between about 0.18 mΩ-cm and about 0.22 mΩ-cm.

17. The semiconductor structure of claim 15, wherein a doping concentration of the epitaxial S/D contact layer is between about $5 \times 10^{20}$ cm$^{-3}$ and about $2 \times 10^{21}$ cm$^{-3}$.

18. The semiconductor structure of claim 15, wherein a germanium concentration of the epitaxial S/D contact layer is between about 55% and about 65%.

19. The semiconductor structure of claim 15, wherein the spacer layer is in contact with a top surface of the epitaxial S/D region and a side surface of the silicide layer.

20. The semiconductor structure of claim 15, wherein an angle between a side surface of the spacer layer and a bottom surface of the spacer layer is between about 75 degrees and about 89 degrees.

* * * * *

UNITED STATES PATENT AND TRADEMARK OFFICE
CERTIFICATE OF CORRECTION

| | | |
|---|---|---|
| PATENT NO. | : 12,477,778 B2 | Page 1 of 1 |
| APPLICATION NO. | : 17/472540 | |
| DATED | : November 18, 2025 | |
| INVENTOR(S) | : Hung et al. | |

It is certified that error appears in the above-identified patent and that said Letters Patent is hereby corrected as shown below:

On the Title Page

Column 1, Item (72), in "Inventors", Line 2, delete "Hsin-Chu" and insert -- Hsinchu --, therefor.

In the Claims

In Column 17, Claim 11, Line 14, delete "toa" and insert -- to a --, therefor.

In Column 17, Claim 13, Line 22, delete "boron doped" and insert -- boron-doped --, therefor.

In Column 18, Claim 20, Line 28, delete "aside" and insert -- a side --, therefor.

Signed and Sealed this
Thirtieth Day of December, 2025

John A. Squires
*Director of the United States Patent and Trademark Office*